US006580137B2

(12) United States Patent
Parke

(10) Patent No.: US 6,580,137 B2
(45) Date of Patent: Jun. 17, 2003

(54) DAMASCENE DOUBLE GATED TRANSISTORS AND RELATED MANUFACTURING METHODS

(75) Inventor: Stephen A. Parke, Nampa, ID (US)

(73) Assignee: Boise State University, Boise, ID (US)

( * ) Notice: Subject to any disclaimer, the term of this patent is extended or adjusted under 35 U.S.C. 154(b) by 0 days.

(21) Appl. No.: 09/942,533

(22) Filed: Aug. 29, 2001

(65) Prior Publication Data

US 2002/0192911 A1 Dec. 19, 2002

Related U.S. Application Data

(60) Provisional application No. 60/229,552, filed on Aug. 29, 2000, and provisional application No. 60/287,226, filed on Apr. 27, 2001.

(51) Int. Cl.[7] ............................................. H01L 21/336
(52) U.S. Cl. ......................................... 257/401; 257/407
(58) Field of Search ................................. 257/347, 401, 257/382, 383, 386, 407

(56) References Cited

U.S. PATENT DOCUMENTS

| | | | |
|---|---|---|---|
| 4,488,162 A | 12/1984 | Jambotkar .................... 357/23 |
| 5,091,324 A | 2/1992 | Hsu et al. ...................... 437/34 |
| 5,212,104 A | 5/1993 | Klose ............................ 437/40 |
| 5,272,432 A | 12/1993 | Nguyen et al. .............. 323/315 |
| 5,329,138 A | 7/1994 | Mitani et al. .................. 257/42 |
| 5,488,237 A | 1/1996 | Kuwata ........................ 257/194 |
| 5,559,368 A | 9/1996 | Hu et al. ..................... 257/369 |
| 5,780,899 A | 7/1998 | Hu et al. ..................... 257/335 |
| 5,889,410 A | 3/1999 | El-Kareh et al. ............ 324/769 |
| 6,020,239 A | 2/2000 | Gambino et al. ........... 438/269 |
| 6,063,699 A | 5/2000 | Hanafi et al. ................ 438/589 |
| 6,100,123 A | 8/2000 | Bracchitta et al. .......... 438/199 |
| 6,100,146 A | 8/2000 | Gardner et al. ............. 438/301 |
| 6,159,807 A | 12/2000 | Bryant et al. ................ 438/289 |
| 6,204,532 B1 | 3/2001 | Gambino et al. ........... 257/329 |
| 6,255,171 B1 | 7/2001 | Noble ......................... 438/266 |
| 6,329,256 B1 | 12/2001 | Ibok ............................ 438/299 |

FOREIGN PATENT DOCUMENTS

| | | |
|---|---|---|
| EP | 0 951 071 | 10/1999 |
| WO | WO 99/44238 | 9/1999 |

OTHER PUBLICATIONS

Adan, A., et al., "Linearity and Low–Noise Performance of SOI MOSFETs for RF Applications," IEEE International SOI Conference, pp. 30–31, Oct. 2000.

Assaderaghi, F., Rausch, W., Ajmera, A., Leobandung, E., Schepis, D., Wagner, L., Wann, H.J., Bolam, R., Yee, D., Davari, B., and Shahidi, "A 7.9/5.5psec Room/Low Temperature SOI CMOS," *Proceedings of the 1997 International Electron Devices Meeting*, Washington D.C., pp. 415–418, 1997.

Assaderaghi, F., Sinitsky, D., Parke, S., Bokor, J., Ko, P.K., and Hu, C. "A Dynamic Threshold–Voltage MOSFET (DTMOS) for Ultra–Low Voltage VLSI," *IEEE Transactions of Electron Devices*, vol. 44, No. 3, pp. 414–422, Mar. 1997.

(List continued on next page.)

*Primary Examiner*—George Fourson
*Assistant Examiner*—Thanh V Pham
(74) *Attorney, Agent, or Firm*—Stoel Rives LLP

(57) ABSTRACT

This invention provides the structure and fabrication process of a completely planar, Damascene double gated transistor. The structure has a novel self-aligned, hyper-abrupt retrograde body and a zero-parasitic, endwall gate-body connection. The structure provides for increased density and enables ultra low power to be utilized. The methods also provide for simultaneously making both four-terminal and dynamic threshold MOSFET devices.

27 Claims, 21 Drawing Sheets

OTHER PUBLICATIONS

Assaderaghi, F., Sinitsky, D., Parke, S., Bokor, J., Ko, P.K., and Hu, C., "A Dynamic Threshold Voltage MOSFET (DTMOS) for Ultra–Low Voltage Operation," *IEEE Electron Device Letters*, vol. 15, No. 12, pp. 510–512, 1994.

Assaderaghi, F., Sinitsky, D., Parke, S., Bokor, J., Ko, P.K., and Hu, C., "A Dynamic Threshold Voltage MOSFET (DTMOS) for Ultra–Low Voltage Operation," *IEDM Technical Digest*, pp. 809–812, Dec. 1994.

Assaderaghi, F., Parke, S., Ko, P.K., and Hu, C., "A Novel Silicon–On–Insultor (SOI) MOSFET for Ultra Low Voltage Operation," *1994 IEEE Symposium on Low Power Electronics*, pp. 58–59, Oct. 1994.

Banna, S., Chan, P., Chan, M., Fung, S., and Ko, P., "Fully–Depleted CMOS/SOI Device Design Guidelines for Low Power Applications," *Proceedings of the 1997 International Symposium on Low Power Electronics and Design*, Monterey, CA, pp. 301–304, 1997.

Bulkeley, William M., "IBM Engineers to Detail Semiconductor Innovation," The Wall Street Journal, Dec. 3, 2001.

Burghartz, J., et al., "Monolithic Spiral Inductors Fabricated Using a VLSI Cu–Damascene Interconnect Technology and Low–Loss Substrates," *IEDM Technical Digest*, pp. 99–102, Dec. 1996.

Burghartz, J., et al., "Spiral Inductors and Transmission Lines in Silicon Technology Using Copper–Damascene Interconnectsf and Low–loss Substrate," *IEEE Transactions on Microwave Theory Techniques*, vol. 45, pp. 1961–1968, Oct. 1997.

Chan, M., Assaderaghi, F., Parke, S., Hu, C., and Ko, P. "Recessed Channel Structure for Fabricating Ultrathin SOI MOSFETs with Low Series Resistance," *IEEE Electron Devices Letters*, vol. 15, No. 1, pp. 22–24, 1994.

Chang, S., et al., "High Performance 0.1um Dynamic Threshold MOSFET Using Indium Channel Implantation," *IEEE Electron Device Letters*, vol. 21, No. 3, pp. 127–129, 2000.

Chang, S., et al., "High–Performance and High Reliability 80nm Gate–Length DTMOS with Indium Super Steep Retrograde Channel," *IEEE Transactions on Electron Devices*, vol. 47, No. 12, pp. 2379–2384, 2000.

Chatterjee, A., et al., "CMOS Metal Replacement Gate Transistors Using Tantalum Pentoxide Gate Insulator," *IEDM Technical Digest*, pp. 777–780, Dec. 1998.

Chung, I., et al., "A New SOI Inverter using Dynamic Threshold for Low–Power Applications," *IEEE Electron Device Letters*, vol. 18, No. 6, pp. 248–250, Jun. 1997.

Colinge, Jean–Pierre, "An SOI Voltage–Controlled Bipolar–MOS Device," *IEEE Transactions on Electron Devices*, vol. 34, No. 4, pp. 845–849, Apr. 1987.

Cristoloveanu, S., "Architecture of SOI Transitors: What's Next?," *2000 IEEE International SOI Conference*, Oct. 2000.

Davari, B., Dennard, R., and Shahidi, G., "CMOS Technology for Low Voltage/Low Power Applications," *Proceedings of the IEEE 1994 Custom Integrated Circuits Conference*, San Diego, CA, pp. 3–10, 1994.

Eggert, D., et al., "A SOI–RF–CMOS Technology on High Resistivity SIMOX Substrates for Microwave Applications to 5GHz," *IEEE Transactions on Electron Devices*, vol. 44, No. 11, pp. 1981–1989, Nov. 1997.

Eimori, T., Oashi, T., Morishita, F., Iwamatsu, T., Tamaguchi, Y., Okuda, F., Shimomura, K., Shimano, H., Sakashita, N., Arimoto, K., Inoue, Y., Komori, S., Inuishi, M., Nishimura, T., and Miyoshi, H. "Approaches to Extra Low Voltage DRAM Operation by SOI–DRAM," *IEEE Transactions on Electron Devices*, vol. 45, No. 5, pp. 1000–1009, 1998.

Ferlet–Cavrois, V., et al., "High Frequency Characterization of SOI Dynamic Threshold Voltage MOS (DTMOS) Transistors, "*IEEE International SOI Conference*, pp. 24–25, 1999.

Funakoshi, S., et al., "Design Guideline and Performance Prediction of 'SBB' SOI MOSFETs," *2000 IEEE International SOI Conference*, pp. 52–53, Oct. 2000.

Haendler, S., et al., "Comparative Low Frequency Noise Analysis in Various SOI Devices: Floating Body, Body–Tied, DTMOS With and Without Current Limiter," *2000 IEEE International SOI Conference*, pp. 126–127, Oct. 2000.

Harada, M., Tsukahara, T., Kodate, J., Yamagishi, A., and Yamada, J., "2GHz RF Front–End Circuits in CMOS/SIMOX Operating at an Extremely Low Voltage of 0.5V," *IEEE Journal of Solid State Circuits*, vol. 35, No. 12, pp. 2000–2004, 2000.

Harada, M., Tsukahara, T., and Yamada, J., "0.5–1V 2GHz RF Front–End Circuits in CMOS/SIMOX," *Proceedings of the 2000 IEEE International Solid–State Circuit Conference*, San Francisco, CA, pp. 378–379, 2000.

Horiuchi, M., "A Dynamic–Threshold SOI Device with a J–FET Embedded Source Structure and a Merged Body–Bias–Control Transistor—Part I: A J–FET Embedded Source Properties," *IEEE Transactions on Electron Devices*, vol. 47, No. 8, pp. 1587–1598, Aug. 2000.

Horiuchi, M., "A New Dynamic–Threshold SOI Device Having an Embedded Resistor and a Merged Body–Bias–Control Transistor," *IEEE*.

Hsu, T., Tang, D., and Gong, J., "Low–Frequency Noise Properties of Dynamic–Threshold (DT) MOSFET's" *IEEE Electron Device Letters*, vol. 20, No. 10, pp. 532–534, 1999.

Huang, X., et al., "Sub 50–nm FinFET: PMOS."

Huang, Q., Piazza, F., Orsatti, P., and Ohguro, T. "The Impact of Scaling Down to Deep Submicron on CMOS RF Circuits," *IEEE Journal of Solid–State Circuits*, vol. 33, No. 7, pp. 1023–1036, 1998.

Inumiya, S., et al., "Conformable Formation of High Quality Ultra–Thin Amorphous Ts2O5 Gate Dielectrics Utilizing Water Assisted Deposition (WAD) for Sub 50nm Damascene Metal Gate MOSFET's," *IEDM Technical Digest*, Dec. 2000.

Jin, W., Chan, P., and Chan, M., "On the Power Dissipation in Dynamic Threshold Silicon–On–Insulator CMOS Inverter," *IEEE Transactions on Electron Devices*, vol. 45, No. 8, pp. 1717/1724, 1998.

Kotaki, H., Kakimoto, S., Nakano, M., Matsuoka, T., Adachi, K., Sugimoto, K., Fukushima, T., and Sato, Y., "Novel Bulk Dynamic Threshold Voltage MOSFET (B–DTMOS) with Advanced Isolation (SITOS) and Gate to Shallow–Well Contact (SSS–C) Processes for the Ultra Low Power Dual Gate CMOS," *Proceedings of the 1996 IEEE International Electron Devices Meeting*, San Francisco, CA, pp. 459–462, 1996.

Kotaki, H., Adachi, K., Sugimoto, K., Nakano. M., Kakimoto, S., and Fukushima, T., "Advanced Trench and LOCOS Isolation technology for Ultra–Low–Power Bulk Dynamic Threshold MOSFET (B–DTMOS)," *Japanese Journal of Applied Physics*, vol. 36, No. 12B, pp. 7660–7664, 1997.

Kotaki, H., et al., "Novel Low Capacitance Sidewall Elevated Drain Dynamic Threshold Voltage MOSFET (LCSED) for Ultra Low Power Dual Gate CMOS Technology," *IEEE*, 1998.

Lee, Yeong–Taek, et al., "Indium Doped nMOSFETs and Buried Channel pMOSFETs with n Polysilicon Gate," Jpn. J. Appl. Phys. vol. 36(1997), pp. 1341–1345, Part 1, No. 3B, Mar. 1997.

Liao, C., et al., "Forming Local Semi–insulating Regions on Silicon Wafers by Proton Bombardment," *Device Research Conference Digest*, pp. 80–81, 1998.

Maeda, S., et al., "Impact of 0.18 μm SOI CMOS Technology using Hybrid Trench Isolation with High Resisivity Substrate on Embedded RF/Analog Applications," *2000 Symposium on VLSI Technology Digest of Technical Papers*.

Matsuki, T., et al., "Cupoly–Si Damascence Gate Structured MOSFET with Ta and TaN Stacked Barrier," *IEDM Technical Digest*, pp. 261–264, Dec. 1999.

Parke, Stephen A., et al., "Bipolar–FET Hybrid–Mode Operation of Quarter–Micrometer SOI MOSFET's" *IEEE Electron device Letters*, vol. 14, No. 5, pp. 234–236, May 1993.

Reyes, A.C., et al., "Silicon As A Microwave Substrate," *MTT–S Technical Digest*, pp. 1759–1762, 1994.

Saito, M., Ono, M., Fujimoto, R., Takashita, C., Tanimoto, H., Ito, N., Ohguro, T., Yoshitomi, T., Momose, H.S., and Iwai, H., "Advantage of Small Geometry Silicon MOSFETs for High Frequency Analog Applications Under Low–Power Supply Voltage of 0.5V," *VLSI Technology Symposium Digest*, pp. 71–72, 1995.

Saito, M., Ono, M., Fujimoto, R., Tanimoto, H., Ito, N., Yoshitomi, T., Ohguro, T., Momose, H.S., and Iwai, H., "0.15–um RF CMOS Technology Compatible with Logic CMOS for Low–Voltage Operation," *IEEE Transactions on Electron Devices*, vol. 45, No. 3, pp. 737–742, 1998.

Shahidi, G., Ning, T., Comfort, J., Chappell, B., Franch, R., Anderson, C., Cook, P., Schuster, S., Rosenfield, M., and Polcari, M., "SOI for a 1–Volt CMOS Technology and Application to a 512Kb SRAM with 3.5 ns Access Time," *Proceedings of the 1993 IEEE International Electron Devices Meeting*, Washington, DC, pp. 813–816, 1993.

Suzuki, Kunihiro, "Counter Doping into Uniformly and Heavily Doped Channel Region of Sub 0.1 μm SOI MOSFET's," 8179 IEEE Electron Device Letters, 17(Jan. 1996), No. 1, New York, US.

Takamiya, M. and Hiramoto, T., "High Performance Electrically Induced Body Dynamic Threshold SOI MOSFET (EIB–DTMOS) with Large Body Effect and Low Threshold Voltage," *IEEE*.

Tanaka, T., Momiyama, Y., and Sugii, T., "Fmas Enhancement of Dynamic Threshold–Voltage MOSFET (DTMOS) Under Ultra–Low Supply Voltage," *Proceedings of the 1997 International Electron Devices Meeting*, Washington, DC, pp. 423–426, 1997.

Terauchi, M., and Terada, K., "Self–Body–Biased SOI MOSFET through Depletion Isolation Effect," *IEEE International SOI Conference*, pp. 36–37, 1999.

Terauchi, M., "A Novel 4T SRAM Cell Using Self–Body–Biased SOI MOSFET Structure Operating at 0.5Volt," *IEEE International SOI Conference*, pp. 52–53, 2000.

Thompson, S., Young, I., Greason, J., and Bohr, M. "Dual Threshold Voltages and Substrate Bias: Keys to High–Performance, Low–Power, 0.1 um Logic Designs," *VLSI Technology Symposium Digest*, pp. 69–70, 1997.

Ugajin, M., Kodate, J., and Tsukunara, T., "A 1V 12mW 2GHz Receiver with 49dB Image Rejection in CMOS/SIMOX," *Proceedings of the 2001 IEEE International Solid–State Circuits Conference*, San Francisco, CA, pp. 288–289, 2001.

Verdonckt–Vandebroek, Sophie, et al., "High–Gain Lateral Bipolar Action in a MOSFET Structure," *IEEE Transactions on Electron Devices*, vol. 38, No. 11, pp. 2487–2495, Nov. 1991.

Wann, C., et al., "A Comparative Study of Advanced MOSFET Concepts," *IEEE Transactions on Electron Devices*, vol. 43, No. 10, pp. 1742–1753, Oct. 1996.

Wann, C., Assaderaghi, F., Dennard, R., Hu, C., Shahidi, G., and Taur, Y., "Channel Profile Optimization and Device Design for Low–Power, High–Performance Dynamic–Threshold MOSFET," *IEDM Technical Digest*, pp. 113–116, Dec. 1996.

Wann, C., Chen, Z., and Roy, K., "Double Gate Dynamic Threshold Voltage (DGDT) SOI MOSFETs for Low Power, High Performance Designs," *Proceedings of the 1997 IEEE International SOI Conference*, Fish Camp, CA, pp. 82–83, 1997.

Wu, Y., et al., "Fabrication of Very High Resistivity Si with Low Loss of Cross Talk," *IEEE Electron Device Letters*, vol. 21, No. 9, pp. 394–396, Sep. 2000.

Yagashita, A., et al., "Dynamic Threshold Voltage Damascene Metal Gate MOSFET (DT–DMG–MOS) with Low Threshold Voltage, High Drive Current, and Uniform Electrical Characteristics," *Proceedings of the 2000 International Electron Devices Meeting*, pp. 423–426, 1997.

Yagashita, A., et al., "High Performance Damascene Metal Gene MOSFET's Fabricated by CMP for 0.1 um Regime," *IEDM Technical Digest*, pp. 785–788, Dec. 1998.

Yagashita, A., et al., "High Performance Metal Gate MOSFET's Fabricated by CMP for 0.1 um Regime," *IEDM Technical Digest*, pp. 785–788, Dec. 1998.

Yang, I., et al., "Back–Gated CMOS on SOIAS for Dynamic Threshold Voltage Control," *IEEE Transactions on Electron Devices*, vol. 44, No. 5, pp. 822–831, May 1997.

Yeh, W.K., et al., "High Performance 0.1 μm Partially Depleted SOI CMOSFET," *2000 IEEE International SOI Conference*, pp. 68–69, Oct. 2000.

SOI Technology: IBM's Next Advance In Chip Design, Jul. 1998.

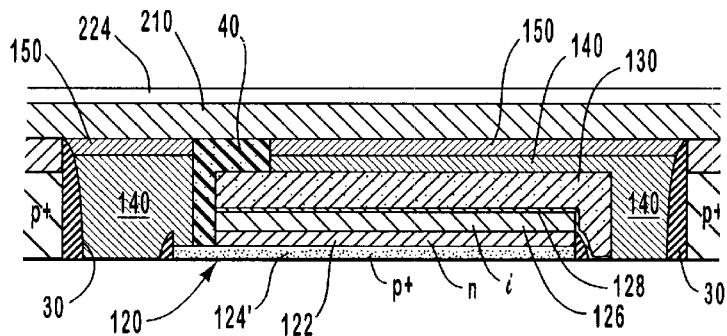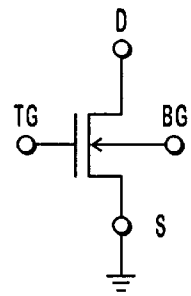
FIG. 14A  FIG. 14B
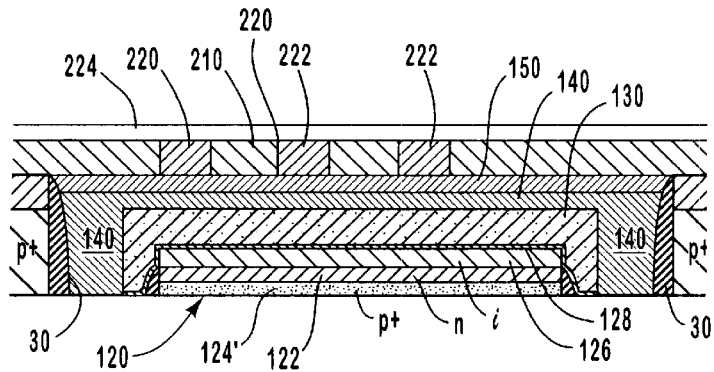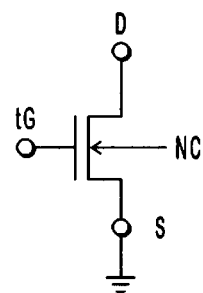
FIG. 15A  FIG. 15B
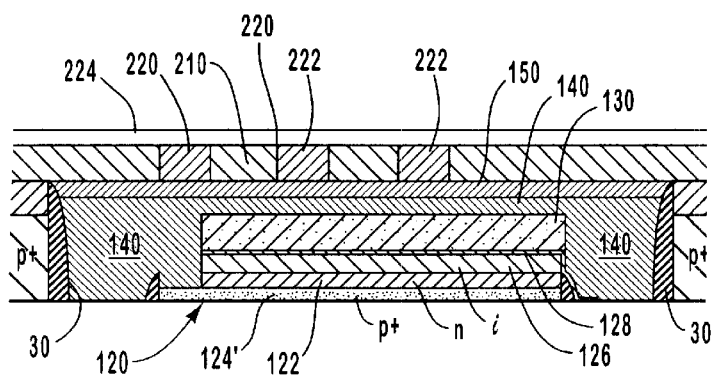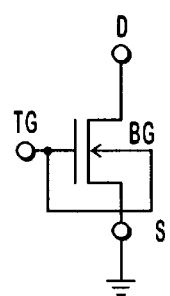
FIG. 16A  FIG. 16B

DAMASCENE DOUBLE GATED TRANSISTORS AND RELATED MANUFACTURING METHODS

RELATED APPLICATIONS

This utility application claims priority to U.S. Provisional Application Serial No. 60/229,552 filed Aug. 29, 2000, which was filed by Stephen A. Parke, Ph.D. and Serial No. 60/287,226 filed on Apr. 27, 2001, which was also filed by Stephen A. Parke, Ph.D. Serial No. 60/229,552 and Serial No. 60/287,226 are hereby incorporated by reference.

TECHNICAL FIELD

This invention relates generally to transistors. More particularly, this invention relates to a transistor that is fully planar and operates at low voltages.

BACKGROUND OF THE INVENTION

The shrinking of silicon-based CMOS transistors from 10 um to sub-100 nm channel lengths has been the driving force behind the incredible advances in integration density of digital circuits. This exponential growth in circuit density (Moore's Law) has enabled increasingly sophisticated and fast microprocessors and digital signal processors. However, in this "post-PC age", the markets driving the semiconductor industry are handheld consumer electronics, wireless communications, and Internet infrastructure. The ITRS Roadmap for the next ten years calls as much or more for increased diversity of integrated functions as for increased density.

CMOS switching frequencies ($f_T$) exceeding 150 GHz have recently been achieved. Because this high-performance can be achieved using a relatively low cost manufacturing process, CMOS is rapidly becoming a serious option for many wireless Radio Frequency (RF) applications that were previously considered to be the exclusive domain of more expensive technologies, such as bipolar and gallium arsenide. This has led to a research focus shift to highly-integrated, highly-diverse CMOS System-On-a-Chip (SOC) technologies, integrating entire wireless mixed-signal systems on a single chip. Innovative device and technology changes are needed to provide high quality passive elements and high-gain, high-linearity, low-noise, low-power, RF capable transistors on carefully engineered substrates which reduce coupling and crosstalk noise of digital circuits from affecting sensitive on-chip RF receivers.

RF SOC's with the lowest possible energy consumption will use advanced spread-spectrum communication algorithms. Current research spans the circuit, architecture, and algorithm issues which impact the design of SOC CMOS wireless transceivers. Research activities also span bulk Si, SiGe, and SOI deep-sub-micron CMOS designs, the design of analog RF front ends, the design of A/D interface circuitry, and digital baseband signal processing. However, it is clear that single chip RF SOC solutions will require more than simply innovative circuit designs in order to be optimized.

The most serious limitation of these portable SOCs is power dissipation. The system battery typically comprises a large percentage of the cost, size, weight, and reliability problems in current handheld RF devices. As these systems become more highly integrated by utilizing sub-100 nm RF-CMOS devices, the power dissipation will become an even greater concern. Therefore, in order for the low-cost and high-integration density of RF-CMOS to be fully realized, it is imperative that new ultra-low power device structures and circuit design techniques be developed. These devices should preferably maintain multi-GHz level performance while operating with power supply voltages down to 0.25 volts. They also should preferably maintain high transconductance and low noise, and be easily integrated with on-chip, high-Q, tunable passive elements such as spiral inductors.

In summary, there is a need in the art for devices that operate at ultra low power. There is a need in the art for innovative transistors that provide for increased density. Additionally, there is a need to simplify the process for manufacturing transistors. Finally, there is a need to reduce the cost of manufacturing transistors.

SUMMARY OF THE INVENTION

An object of the present invention is provide unique transistors that enable increased density. Another object of the present invention is provide transistors that operate at ultra low power. An additional object of the present invention is to simplify the process for manufacturing transistors. Finally, an object is to reduce the cost of manufacturing transistors.

The above and other objects and advantages, which will be apparent to one of skill in the art, are achieved in the present invention which is directed to, in the first aspect, a method of manufacturing a Damascene double gated transistor, and the structure made by the method. More particularly, the invention provides a method for simultaneously making both four-terminal and dynamic threshold MOSFET devices. The method starts with either 1) a high-resistivity bulk silicon substrate (with or without an epitaxial layer) or 2) a silicon-on-insulator substrate or similar substrate having an isolated semiconductor region defined on its surface. These substrates may be created by any of the existing methods for making 1) high-resistivity bulk silicon or 2) high-resistivity SOI i.e. SIMOX, BESOI, SmartCut, Metal-induced recrystallization, Laser-induced recrystallization, etc.

In one embodiment, a silicon trench etch hard mask and polish stop "pad" layer (e.g. silicon nitride) is first deposited on the top silicon layer. A merged isolation/gate trench is then etched partially through this top silicon layer. A second mask and etch are used to completely remove the remaining silicon from the bottom of the isolation trenches, while leaving a thin active region of silicon under the gate trench which will become the channel. The remaining silicon "island" is barbell shaped, with large, thick source/drain regions on either side of the narrow, thin channel region. The gate trench is used for subsequently forming the bottom gate, channel, and top gate which are all self-aligned to this trench opening. A complementary set of shallow and deep implants is used to form a counter-doped channel and to heavily, uniformly dope the source/drain regions, respectively. This counter-doped channel is especially useful for maximizing the dynamic threshold swing, since it enhances body effect. Sidewall spacer material is then deposited, both to narrow the gate opening for sub-lithographic channel length and to isolate the sidewalls of the source/drain regions. Following the spacer formation, a highly-doped buried bottom gate is formed by ion implantation. This implant is masked by both the pad and the spacers, which space it away from both the heavily doped source and drain regions to prevent leakage and capacitance. The energy of this implant is high enough to place it below the counter-doped channel layer. High atomic weight ions are used (Indium for p+ and arsenic for n+) in order to obtain a super-steep retrograde implant profile between this buried layer and the channel above. Optionally, a thin undoped selective epitaxial silicon layer may be grown on top of the counter-doped channel to enhance the mobility of the device. At this point in the process, all high temperature steps are complete, meaning that temperature-sensitive materials (such as hafnium oxide and copper) may be used for the gate stack. Polysilicon or polysilicon/germaninum with an adjustable percentage of Ge may be used as the first gate conductor layer, in order to achieve additional threshold voltage design control. Alternately, a metal or silicide may also be used for the first gate conductor layer. The isolation/gate trenches are overfilled with this first gate conductor material, planarized back to the pad layer, and plasma recessed. Next, the entire channel and gate stack is patterned and etched, stopping on the bottom gate layer. The alignment of this mask to the original channel mask determines whether the resulting device is four-terminal, DTMOS, or floating body. All three types of devices are fabricated simultaneously on the same substrate and may be used as needed for various circuit applications. Next, the trenches are refilled with isolation dielectric (e.g. silicon dioxide) and planarized. This trench dielectric is then patterned and etched out in order to form a "Damascene" metal local interconnect (LI or M0) for wiring the top and bottom gates to adjacent circuits. This metal (second gate conductor) is deposited to overfill the trenches, planarized back to the pad layer, and plasma recessed slightly. This recess is then filled with a "cap" dielectric (e.g. silicon dioxide) and planarized. This cap prevents the subsequent contact etch from reaching the buried local interconnect metal. Finally, an interlevel dielectric is deposited and either plasma etched or Dual-Damascene metal one and contact one levels are patterned, etched, filled and planarized. The contact etch is selective, penetrating the pad dielectric in order to contact the top of the junctions, but not penetrating the trench cap dielectric. Thus the source/drain contacts are self-aligned with respect to the gate and isolation regions. Typical interconnect processing is used for all subsequent levels.

This invention describes the structure and fabrication process of a novel completely planar, dam double-gated MOSFET device structure which overcomes several key existing problems and extends the DTMOS advantages to both bulk and SOI sub-100 nm CMOS technologies. This process permits easy incorporation of high-K gate dielectrics, such as tantalum pentoxide, and low resistance metal gates, such as copper, with a novel self-aligned, hyper-abrupt retrograde body implant. Current drive/speed, power-delay product, transconductance, output resistance, linearity, noise, hot-electron reliability, and device threshold matching are all superior to existing MOSFET designs. This invention's applications are far-reaching, but are particularly enabling for 0.25 V-1.0V mixed-signal & RF CMOS SOC building block circuits. Between the large power supply reduction and superior analog/RF performance, order of magnitude power reductions can be achieved with this approach. This invention's application primary focus is on highly integrated CMOS system-on-a-chip (SOC) implementations, which have the lowest possible energy consumption while using advanced spread-spectrum communication algorithms. This includes multi-GHz wireless transceivers. Applications span bulk and SOI deep-sub-micron (DSM) and sub-100 nm CMOS technologies. It is expected that the application of this invention will permit single-chip digital pico-radios capable of supporting a wide variety of data types ranging from low bandwidth data, control, voice, and text messaging, up to full streaming video in a variety of pocket and handheld devices.

In one embodiment, the structure comprises a silicon transistor in which the gate is constructed of two conducting layers and a capping insulating layer that are all embedded in a groove etched into the original SOI or epitaxial silicon layer. The result is a completely planar structure with low gate, body, and S/D resistances. Both the sequence of process steps and the resulting transistor structure are novel. The gate layers are all deposited after the high-temperature source/drain processing is complete, thus protecting them from possible high-temperature damage. A compact, low capacitance endwall (sometimes referred to as a sidewall) contact is formed between the top gate material and the self-aligned hyper-abrupt retrograde body. In one embodiment, this structure is built on a high-resistivity SOI wafer. In another embodiment, it is built on high-resistivity epitaxial bulk silicon wafers, permitting the typical triple well processing to be eliminated. These devices can also be integrated with conventional CMOS devices (non-DTMOS) on the same chip to achieve tradeoffs.

A novel zero-area, zero capacitance, low-resistance endwall contact is formed between the gate second layer and the buried low-resistance hyper-retrograde body region. The invention also provides a new hyper-abrupt retrograde well structure formed by counter-doping a pre-existing S/D implant only in and below the channel region, which is self-aligned to the channel and does not touch the source/drain junctions. This structure especially benefits bulk silicon implementation of DTMOS, achieving most of the benefits of SOI DTMOS implementations.

This invention further provides a method for eliminating conventional well processing (Well-less CMOS), while maintaining sufficient isolation, by using high-resistivity epitaxial isolation coupled with sub-volt biases (and optional VDD/2 epi substrate bias), thereby dramatically reducing the complexity/cost of bulk silicon DTMOS implementations. This bulk silicon "semi-insulating" substrate design also decreases the cross-talk, noise coupling, and passive component Q losses typical of existing bulk CMOS processes.

Conventional DTMOS processes typically include a typical plasma-etched polysilicon gate process, which leads to a highly-non-planar gate stack, high-resistance gate stack, plasma etch damage to the gate oxide, depletion of the poly gate, boron penetration through the gate dielectric, and incompatibility with high-temperature-intolerant gate stack materials. This last problem is due to the source/drain implant thermal processing, which usually follows the gate formation, leading to this process flow being labeled "gate first". The processes disclosed herein includes a novel "recessed-channel" type of Damascene metal "gate-last" process that results in effectively raised source/drain regions for reduced S/D resistance. The processes also result in a novel dielectrically-capped, planar gate that permits self-aligned, borderless S/D contacts that will not short the gate even with complete overlap.

Additional aspects and advantages of this invention will be apparent from the following detailed description of preferred embodiments thereof, which proceeds with reference to the accompanying drawings.

BRIEF DESCRIPTION OF THE DRAWINGS

FIG. 14A is provided for comparison to FIG. 14A and depicts a cross sectional view along the width of the device that is identical to FIG. 12B.

FIG. 14B schematically depicts the terminal connections of the device.

FIG. 15A shows the floating body configuration of the device.

FIG. 15B schematically depicts the terminal connections of the device.

FIG. 16A shows the dynamic threshold configuration of the device.

FIG. 16B schematically depicts a cross sectional view of the device showing the terminal connections of the device.

DETAILED DESCRIPTION OF PREFERRED EMBODIMENTS

Figure 1A:
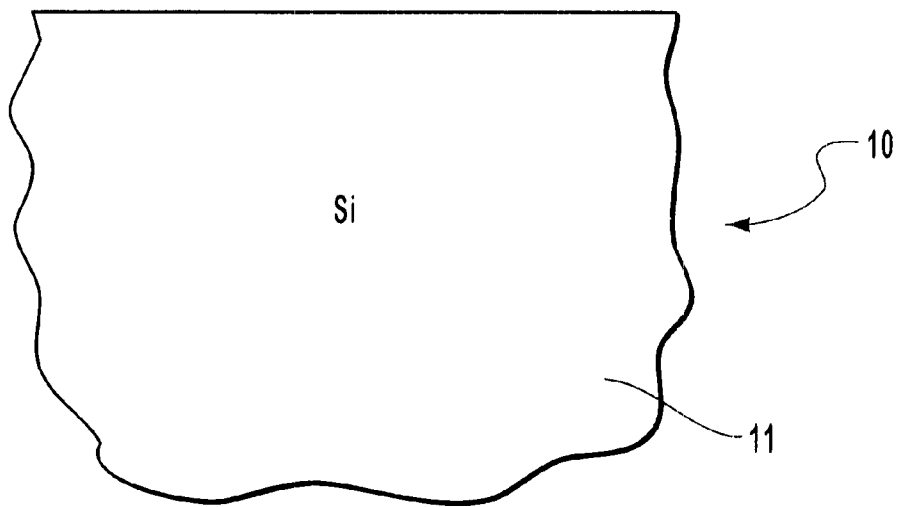
FIG. 1A is a cross-sectional view a high-resistivity bulk starting wafer.

In describing an embodiment of the present invention, reference will be made in the drawings to elements of an embodiment by numerals that refer to like elements in another embodiment of the invention. Note that features of the invention are not necessarily shown to scale in the drawings. The device is described and drawn in an N-channel configuration, but the process provides complementary implants to simultaneously build P-channel devices as well.

Figure 23A:
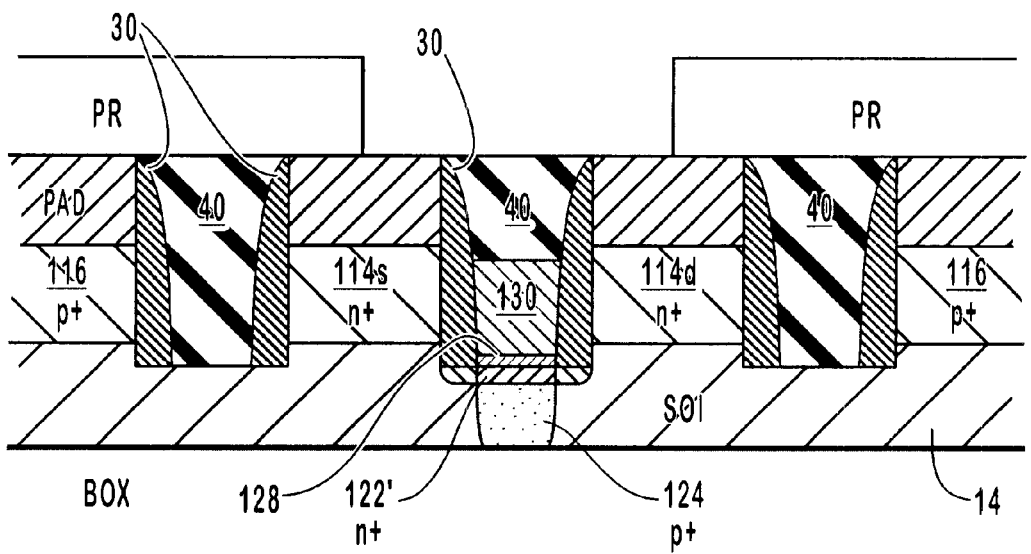
FIG. 23A depicts a cross sectional view along the width of the device after the step of etching oxide down to BOX layer 13.
Figure 23B:
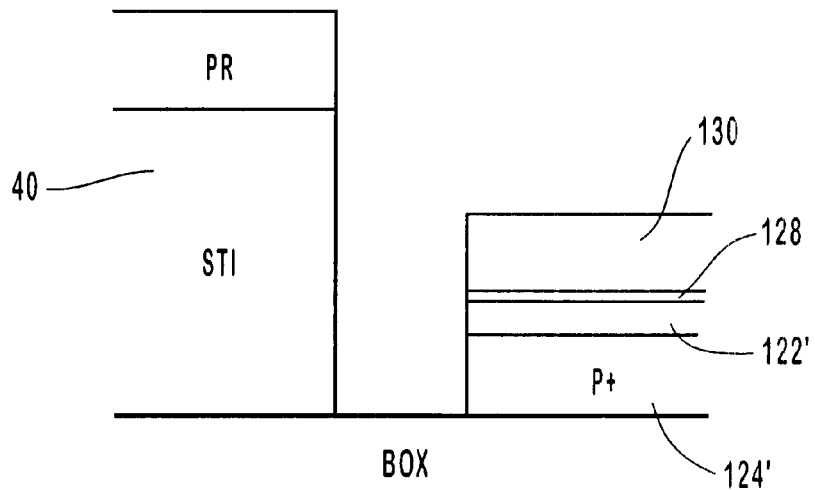
FIG. 23B depicts a cross sectional view along the length of the device after the step of etching oxide down to BOX layer 13.
Figure 24A:
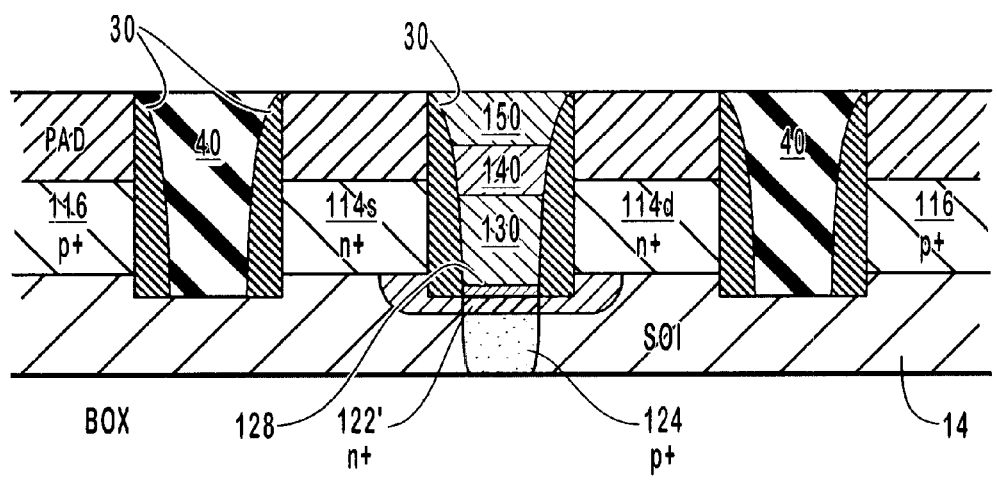
FIG. 24A depicts a cross sectional view of the Damascene double gated transistor taken along the channel length direction.
Figure 24B:
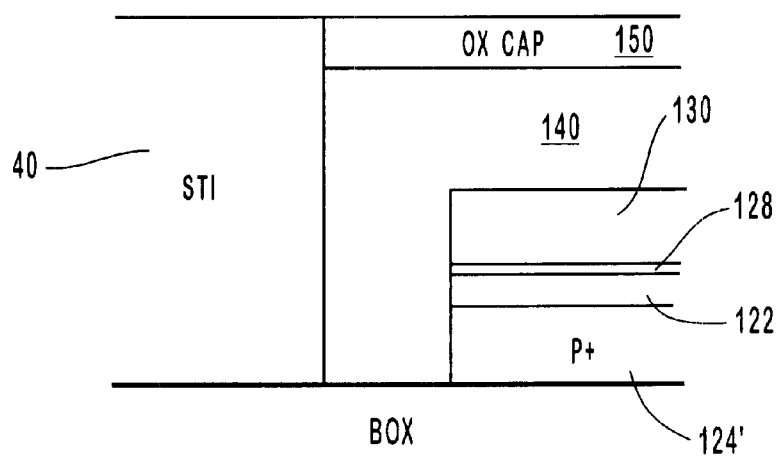
FIG. 24B depicts a cross sectional view of the Damascene double gated transistor taken along the channel width direction.
Figure 25A:
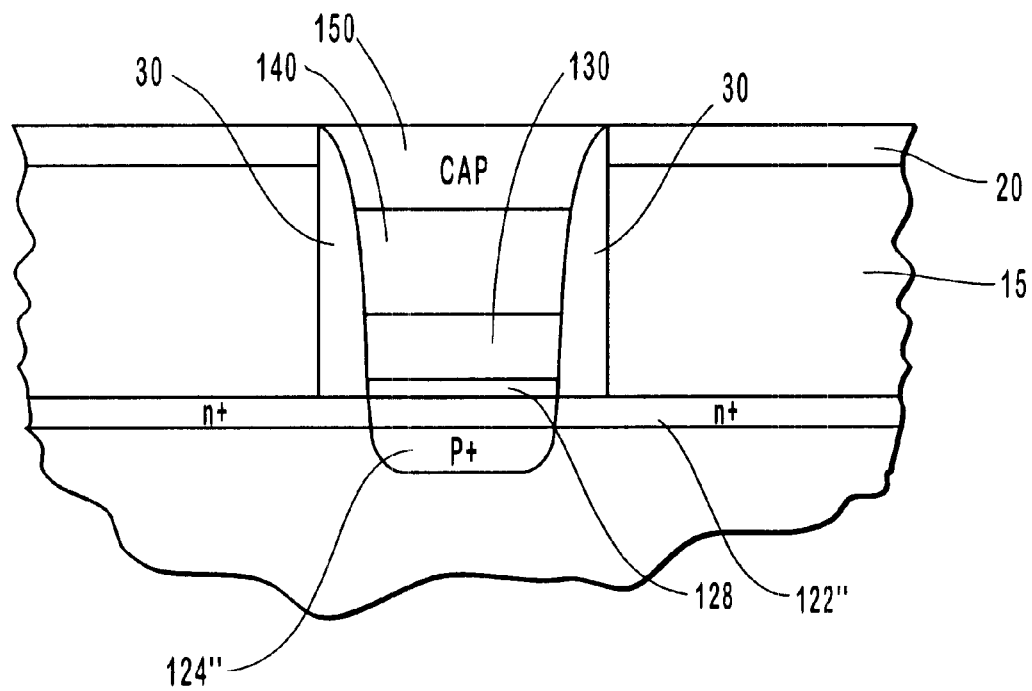
FIG. 25A is a cross sectional view of another embodiment of the Damascene double gated transistor.

Several methods are disclosed herein for forming Damascene double gated transistors. Before explaining the steps of the method shown in FIGS. 2–12 that are used to achieve the final structure, it is useful to appreciate the configuration of the final structure shown in FIGS. 11A–D and FIGS. 12A–D. Another method is depicted in FIGS. 17–24 with the final structure shown in FIGS. 24A–24B. FIG. 25A depicts an additional embodiment.

Figure 1B:
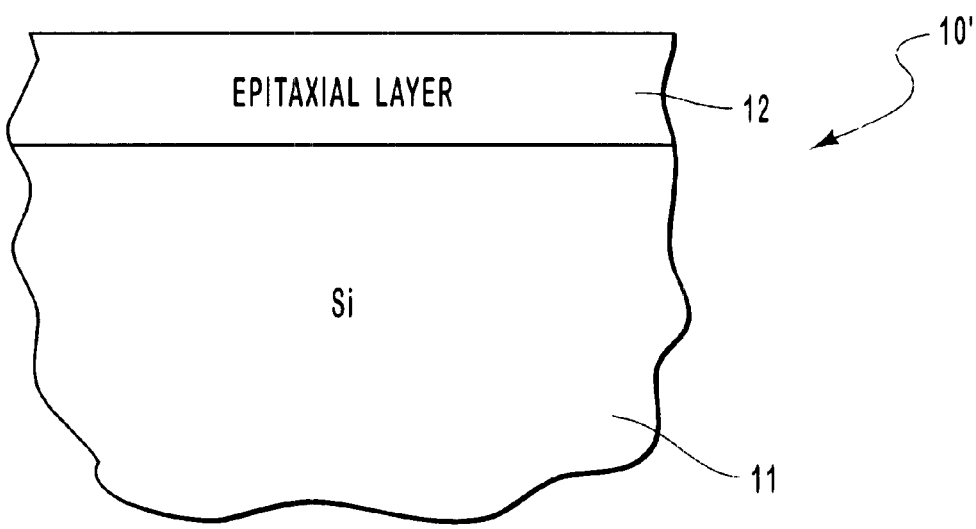
FIG. 1B is a cross-sectional view of a low-resistivity bulk starting wafer, with a high-resistivity epitaxial layer deposited on top.
Figure 2A:
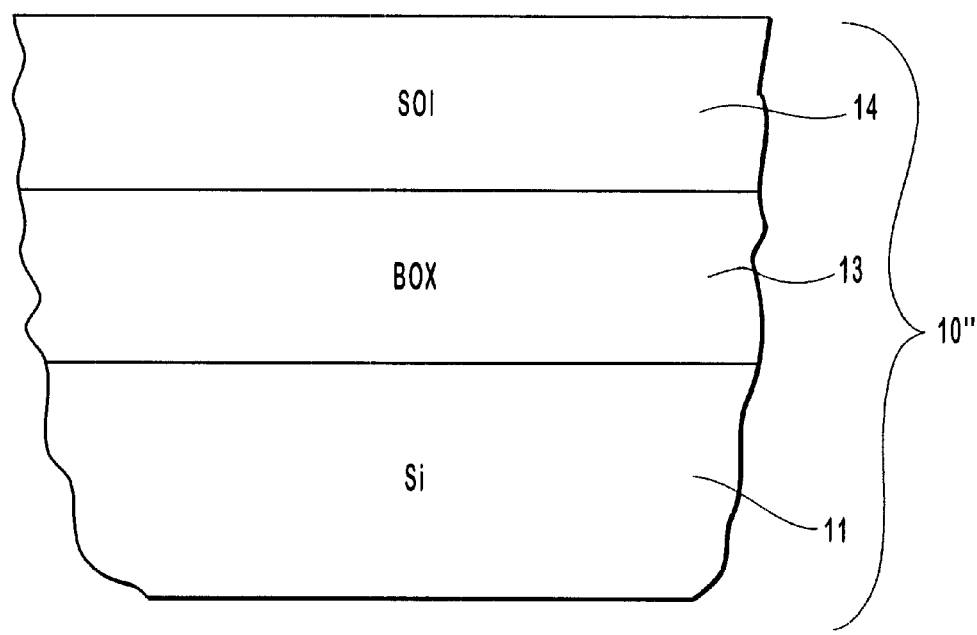
FIG. 2A is a cross-sectional view of a high-resistivity SOI starting wafer.

FIGS. 1A–1B and 2A depict some of the various substrates that can be used in accordance with the inventive methods and structures. Substrate 10 shown in FIG. 1A is bulk silicon 11 that preferably has a high resistivity such as 1 k ohm-cm or greater. For example, the resistivity may range from 100 ohm-cm to 10 k ohm-cm. Alternatively, a triple-well bulk silicon substrate may be used instead. Substrate 10' shown in FIG. 1B has a high-resistivity epitaxial layer 12 on bulk silicon 11' which has a low resistivity. The low resistivity of silicon 11' may range from 0.1 to 10 ohm-cm.

FIG. 2A depicts a starting silicon-on-insulator (SOI) substrate 10". Layer 11 is the silicon substrate. Substrate 10" has a layer 13 that is under a SOI layer 14 and above silicon layer 11. Layer 13 is a buried insulator (typically silicon dioxide referred to as a BOX layer). The thickness of BOX layer 13 may vary from several microns down to 100 nm, however, the thickness is preferably in a range from about 100 nm to about 500 nm. Layer 14 is the thin crystalline silicon (SOI) layer where devices are built. SOI layer 14 may be formed by any desirable available method such as SIIMOX, SmartCut bonded, Metal-induced poly recrystallization, etc. Layer 14 preferably has a high resistivity of 1 k ohm-cm, for example. The initial crystalline SOI film thickness may be any available thickness but is preferably either thinned by etching or thickened by epi-growth to a range from about 200 nm to about 300 nm. Note that substrate 10" is a preferred embodiment and may be particularly useful for a RF-CMOS application.

Another substrate 10''' (not shown) may also be utilized that has four layers. The surface layer is an epitaxial layer 12'. Epitaxial layer 12' preferably has a thickness in a range from about 100 nm to about 200 nm. Epitaxial layer 12' is on a layer of silicon 11' that has a low resistivity and preferably a thickness of about 100 nm. Silicon layer 11' is on BOX layer 14. BOX layer 14 preferably has the same thickness range as BOX layer 14 described above in reference to substrate 10". BOX layer 14 is on a bottom layer of silicon 11' that has low resistivity, preferably about 10 ohm-cm.

Figure 2B:
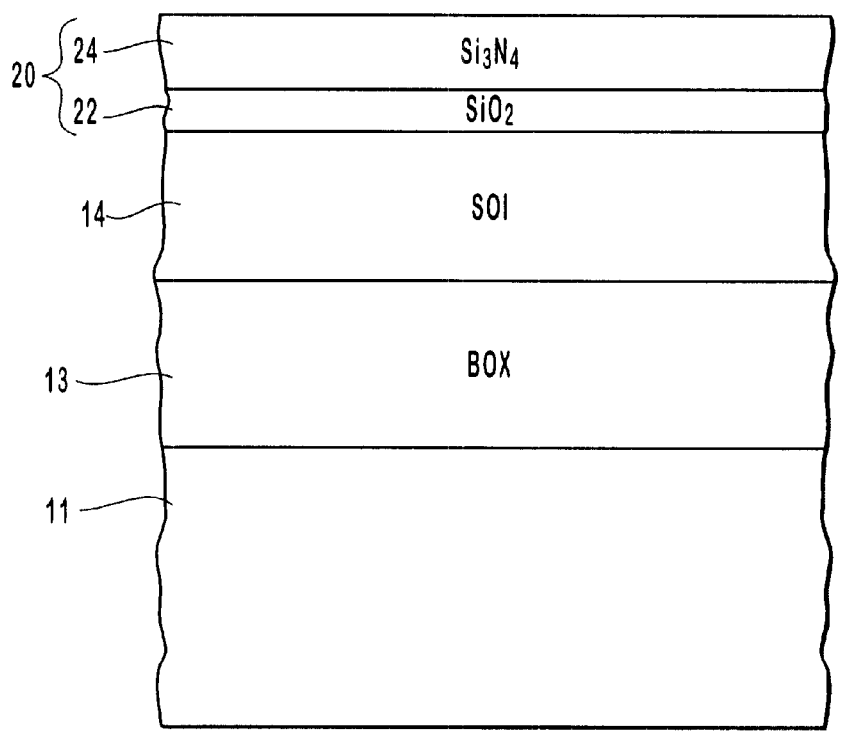
FIG. 2B is a cross-sectional view of the high-resistivity SOI starting wafer shown in FIG. 2A after pad 20 has been deposited on top.
Figure 3A:
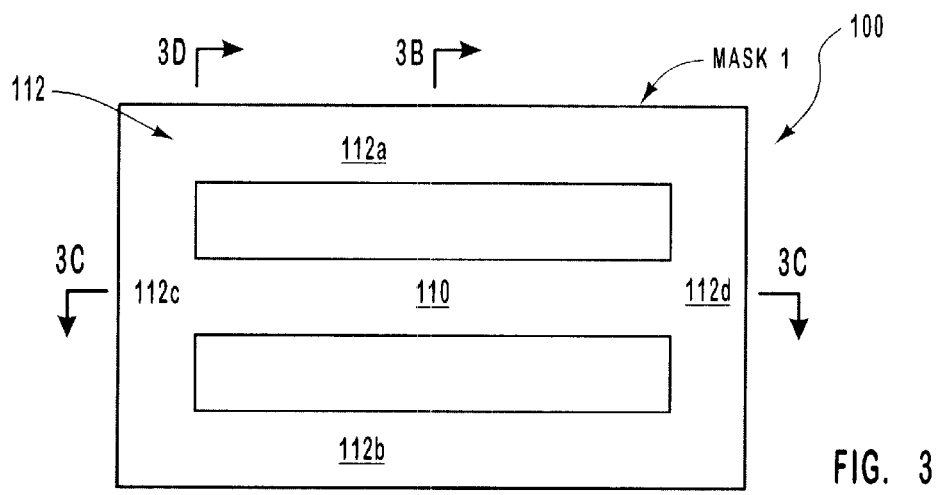
FIG. 3A is a plan view of the device after trenches have been etched into the top silicon layer.
Figure 3B:
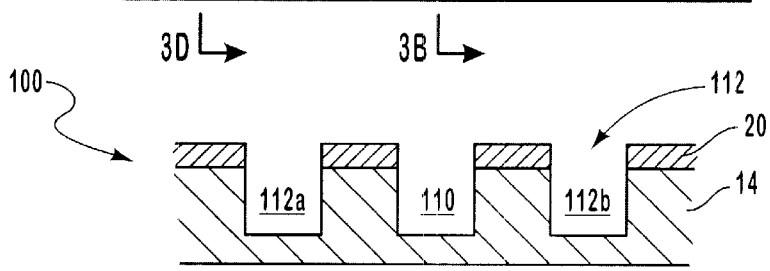
FIG. 3B is a cross sectional view taken along the width of the device after trenches have been etched into the top silicon layer.
Figure 3C:
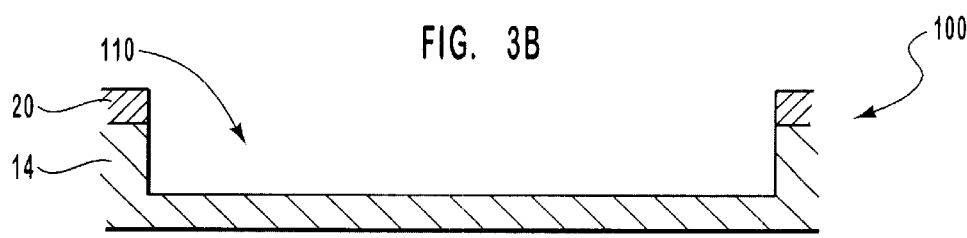
FIG. 3C is a cross sectional view along the length of the device after trenches have been etched into the top silicon layer.
Figure 3D:
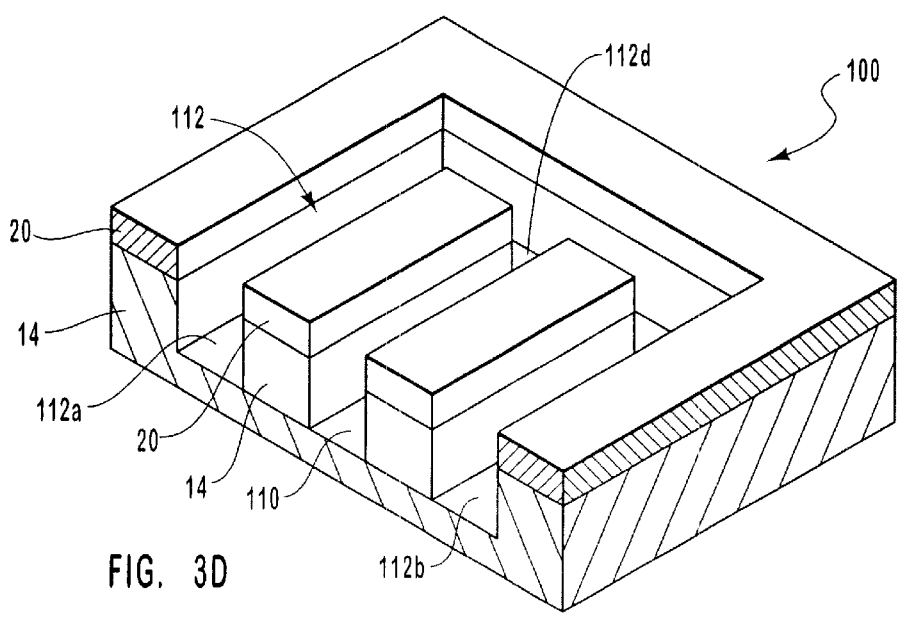
FIG. 3D is an isometric view of the device taken along cutting line 3D after trenches have been etched into the top silicon layer.
Figure 4A:
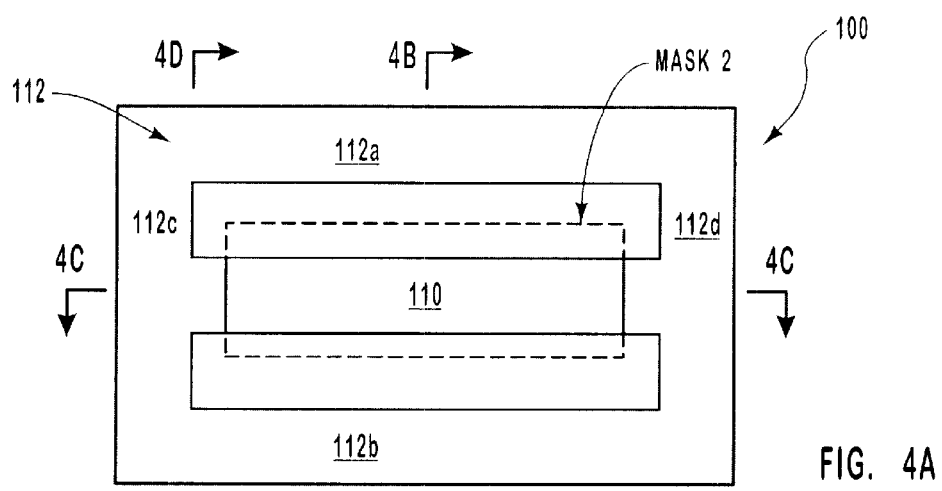
FIG. 4A is a plan view of the device after a second silicon etch.
Figure 4B:
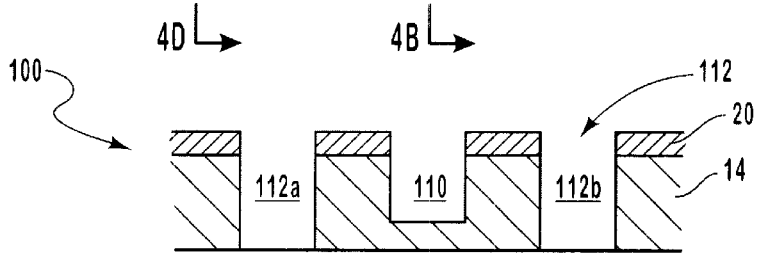
FIG. 4B is a cross sectional view taken along the width of the device after a second silicon etch.
Figure 4C:
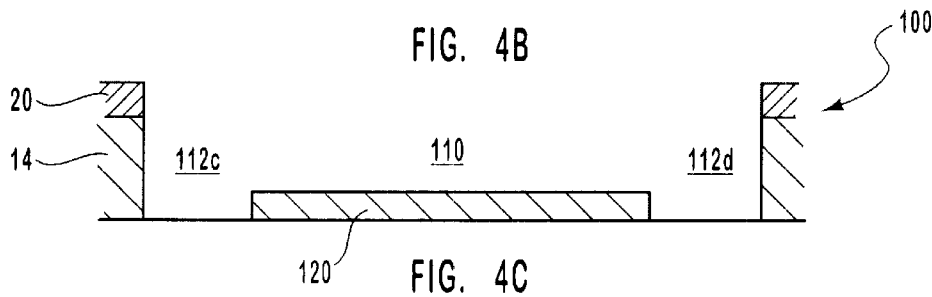
FIG. 4C is a cross sectional view along the length of the device after a second silicon etch.
Figure 4D:
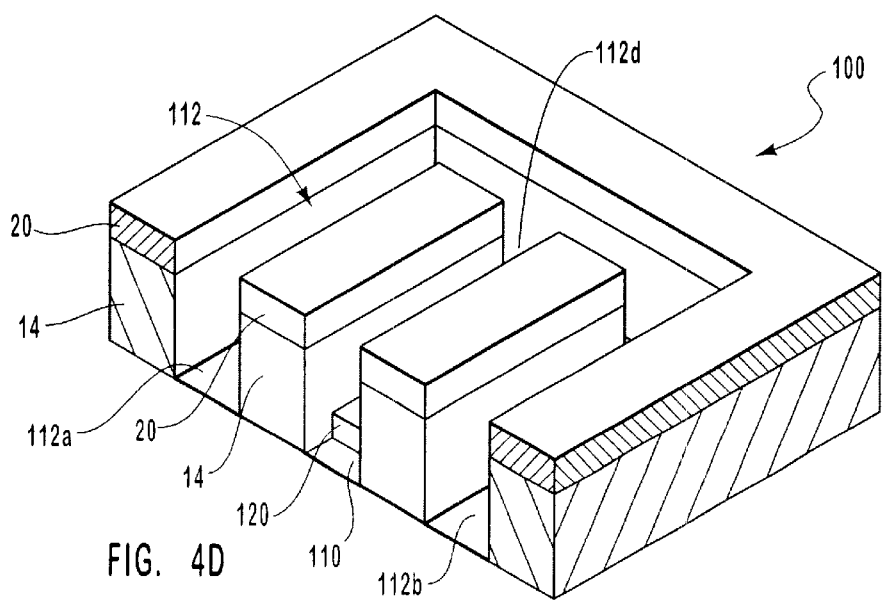
FIG. 4D is an isometric view of the device taken along cutting line 4D after a second silicon etch.
Figure 5A:
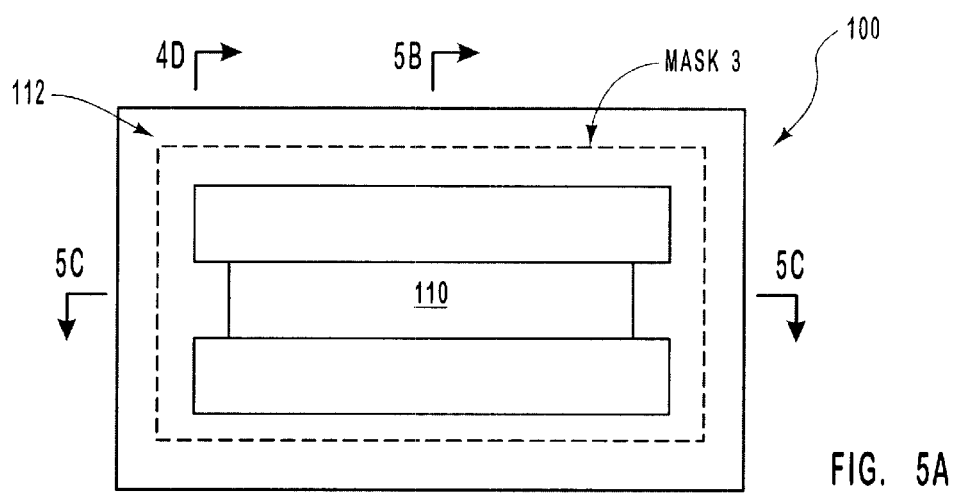
FIG. 5A is a plan view of the device after mask 3 has been implanted.
Figure 5B:
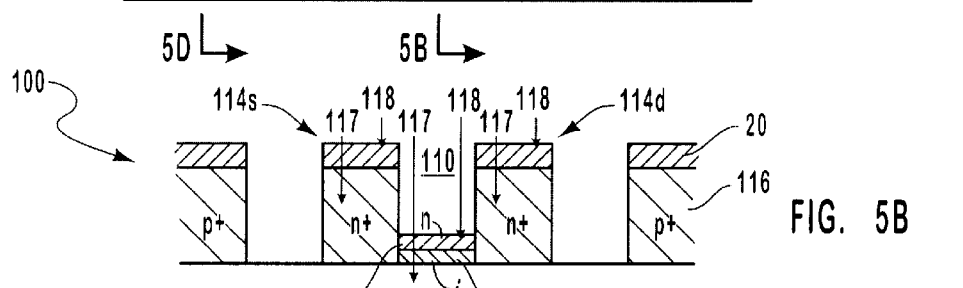
FIG. 5B is a cross sectional view taken along the width of the device after mask 3 has been implanted.
Figure 5C:
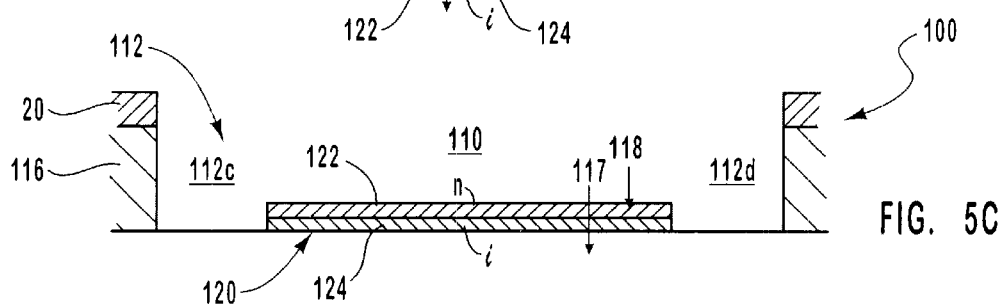
FIG. 5C is a cross sectional view along the length of the device after mask 3 has been implanted.
Figure 5D:
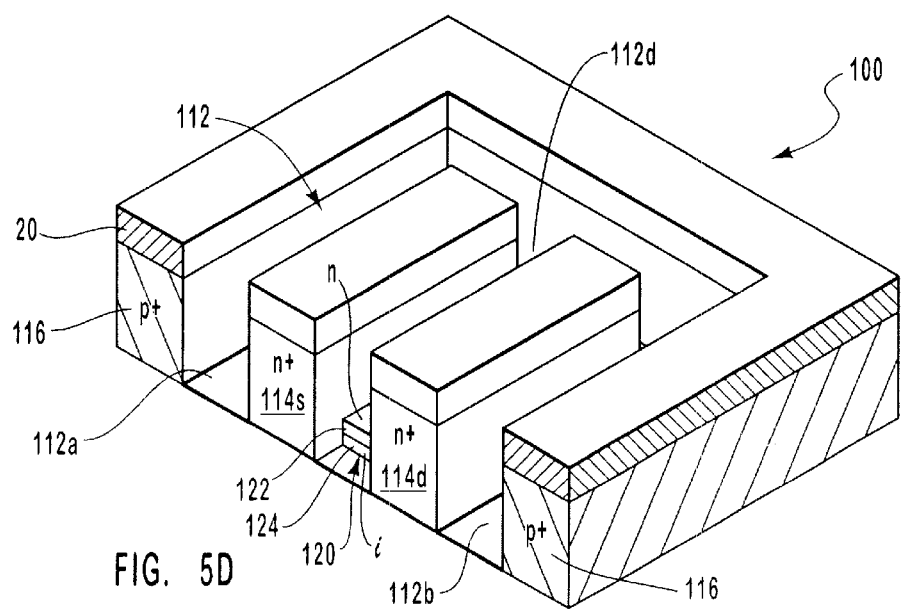
FIG. 5D is an isometric view of the device taken along cutting line 5D after mask 3 has been implanted.
Figure 6A:
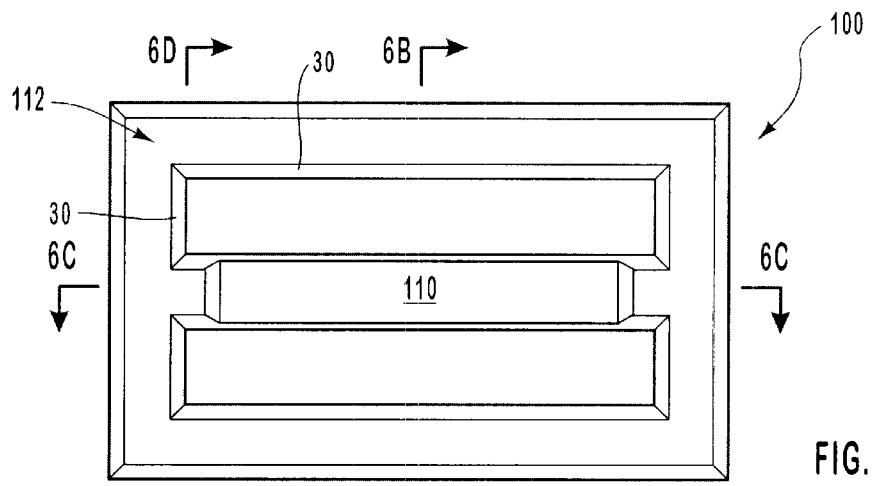
FIG. 6A is a plan view of the device after formation of sidewall spacers and after implant 119.
Figure 6B:
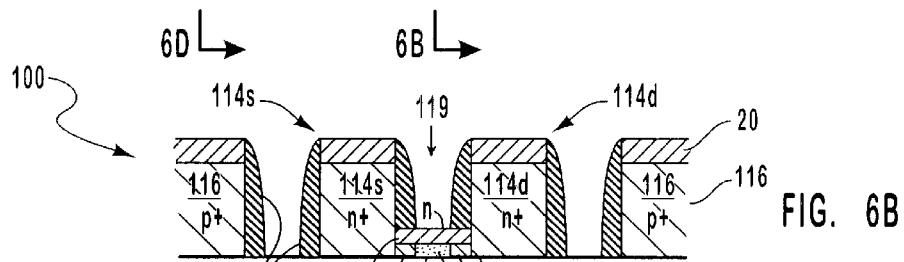
FIG. 6B is a cross sectional view taken along the width of the device after formation of sidewall spacers and after implant 119.
Figure 6C:
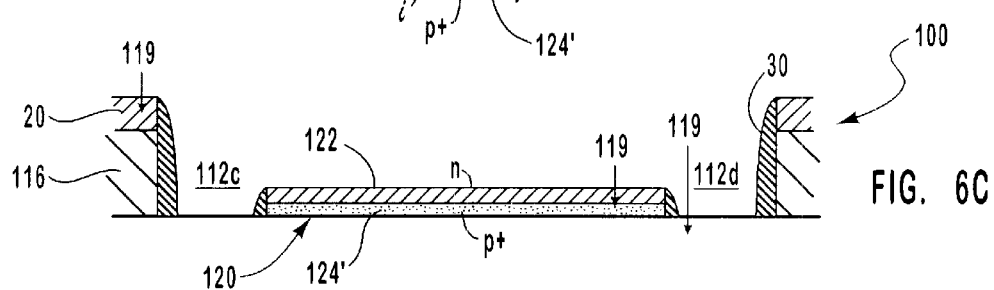
FIG. 6C is a cross sectional view along the length of the device after formation of sidewall spacers and after implant 119.
Figure 6D:
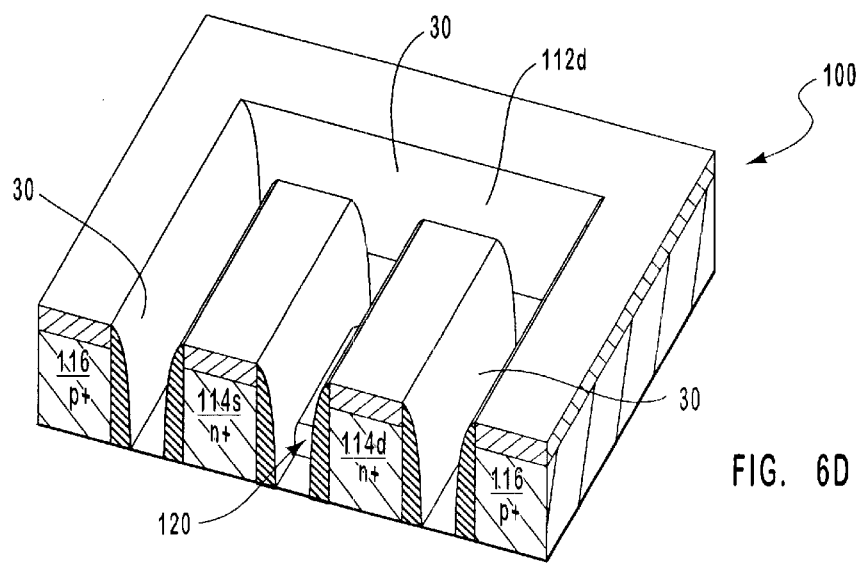
FIG. 6D is an isometric view of the device taken along cutting line 6D after formation of sidewall spacers and after implant 119.

As shown in FIG. 2B, once an appropriate substrate such as substrate 10" has been obtained then the pad 20 is formed. Pad 20 preferably includes a silicon nitride layer 24 over a thin silicon oxide stress relief layer 22. Pad 20 is the silicon etch hard mask and the chemical-mechanical polish (CMP) stop layer. Silicon nitride ($Si_3N_4$) layer 24 may have a thickness ranging from about 50 nm to about 200 nm. Layer 22 may be deposited or grown to be used as both a silicon etch hardmask and as a chemical-mechanical polish (CMP) stopping layer without an oxide layer. The oxide layer 24 is a very thin layer of thermal oxide 24. For example layer 24 may have a thickness of about 20 nm to about 40 nm.

Pad 20 is formed from a different material than the dielectric materials that surround the gate, namely spacers 30 and cap 150, which are discussed below. For a pad that comprises a silicon nitride layer 22 over a thin silicon oxide stress relief layer 24, spacers 30 and cap 150 comprise silicon dioxide. Conversely, for a pad 20 that comprises merely silicon dioxide, spacers 30 and cap 150 comprise silicon nitride.

FIGS. 3–12 provide views of the various steps involved in forming the final Damascene double gated transistor referred to herein as device 100 throughout the description of the process. At each step, four views are provided including a plan view referenced by A, a cross-sectional view taken along the width of the device referenced by B, a cross-sectional view taken along the length of the device referenced by C and an isometric view of the device along cutting line D in each plan view referenced by A.

FIGS. 3A–D provide various views of the device after the first masking/patterning step has been completed utilizing mask 1. Merged gate trench 110 and isolation trench 112 are etched into the top silicon layer, leaving a 50–200 nm thick silicon layer 14 remaining on BOX layer 13. Note that the different portions of isolation trench 112 are individually identified as 112a–d. This mask is the union shape of typical CMOS Active Area & Gate masks. The silicon substrate layer 11 and BOX layer 13 are omitted from the subsequent drawings for clarity, however, it should be understood that layer 14 remains on BOX layer 13 which is on silicon substrate layer 11.

FIGS. 4A–4D show the result of the second mask identified as mask 2, which protects the channel region 120 from a second silicon etch. This second etch removes the rest of the silicon from the bottom of the trenches 112 in the isolation regions around the channel, source, and drain, stopping on the BOX layer 13.

FIGS. 5A–D shows the results of two sets, one deep 117 and one shallow 118, of masked, complementary ion implants utilizing mask 3. These implants are used to form the source/drain junctions or regions and a channel region 120. As discussed below, channel region 120 has a counter doped channel layer or portion 122 and a remaining bottom intrinsic layer or portion 124. The n+ regions correspond with the source and drain pedestals respectively identified in FIG. 5D as 114s and 114d. The p+ regions correspond with a surrounding p+ source/drain pedestal identified in FIG. 5D as 116. Note that p+ source/drain pedestal 116 belongs to adjacent p+ devices so it is not a part of device 100.

The deep n+ implant 117 may be a series of implants of various energies and doses in order to form a uniformly, heavily doped source/drain all the way down to the BOX layer 13. The counter doped channel layer 122 has a very abrupt profile in order to leave the bottom intrinsic layer 124 undoped, so heavy ion species are used such as Indium and Arsenic. Since BOX layer 13 and pad 20 are dielectrics, they permit use of these "shallow/deep" pair of implants. More particularly, because these regions are dielectric the dopants are implantable into these regions without significantly affecting the device structure or operation.

FIGS. 6A–6D shows the formation of sidewall spacers 30 followed by a high-dose, relatively high-energy p+ implant 119, such as Indium, that forms the buried low-resistance bottom gate 124' of device 100. Note that sidewall spacers 30 comprise silicon dioxide in this embodiment. It should be noted that the bottom gate 124' is self-aligned to the bottom of the gate trench 110 between the two spacers 30 and these spacers 30 prevent bottom gate 124' from abutting either the heavily-doped source or drain regions or pedestals 114s and 114d, leaving regions of bottom intrinsic layer 124 to the left and right of the bottom gate 124' that are undoped or at least lightly doped. These intrinsic regions of bottom intrinsic layer 124 are identified with the letter i.

Figure 7A:
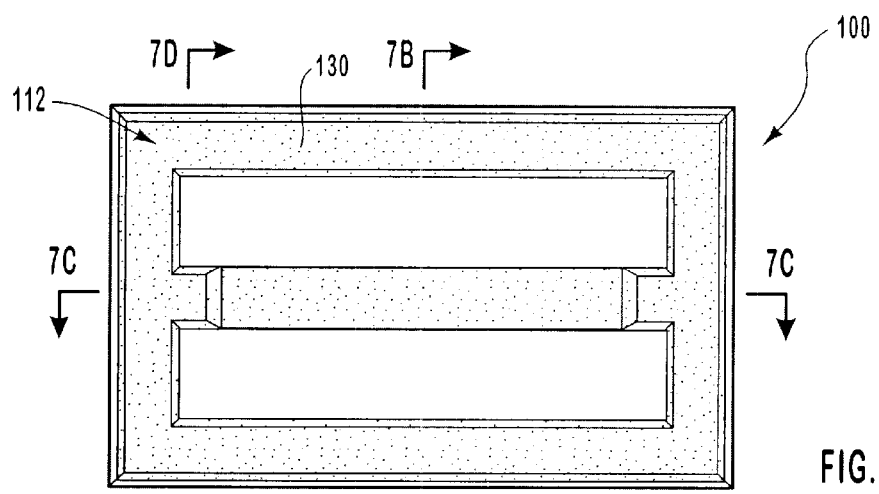
FIG. 7A is a plan view of the device after the formation of a first gate conductor layer.
Figure 7B:
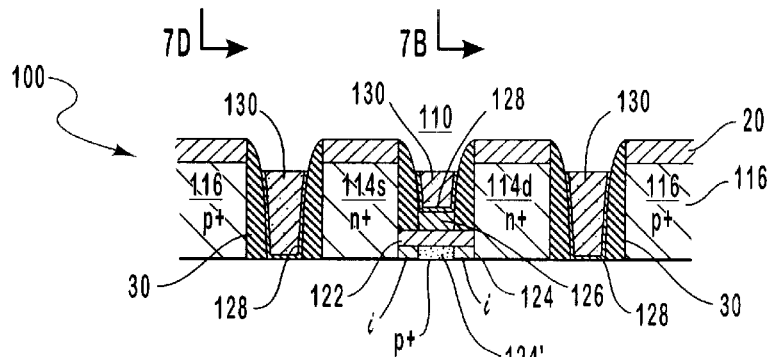
FIG. 7B is a cross sectional view taken along the width of the device after the formation of a first gate conductor layer.
Figure 7C:
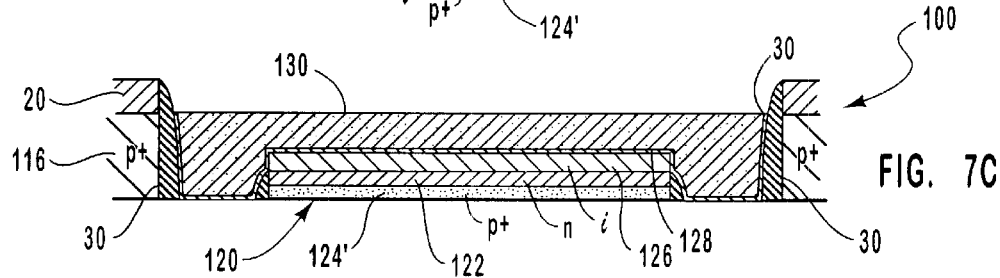
FIG. 7C is a cross sectional view along the length of the device after the formation of a first gate conductor layer.

FIGS. 7A–7D depict the formation of a first gate conductor layer 130 over channel region 120. A gate dielectric layer 128, preferably having a high dielectric constant, such as hafnium oxide, underlies first gate conductor layer. Additionally, it is preferable to form a thin undoped selective epitaxial silicon layer on top of the counter-doped channel layer 122 to enhance the mobility of the device as shown in FIGS. 7B–7C at 126 before forming the gate dielectric layer 128 and first gate conductor layer 130. After the selective epitaxial silicon layer 126 is formed, all high temperature steps are complete, meaning that temperature-sensitive materials, such as hafnium oxide and copper may respectively be used for the gate dielectric and conductor material.

Figure 7D:
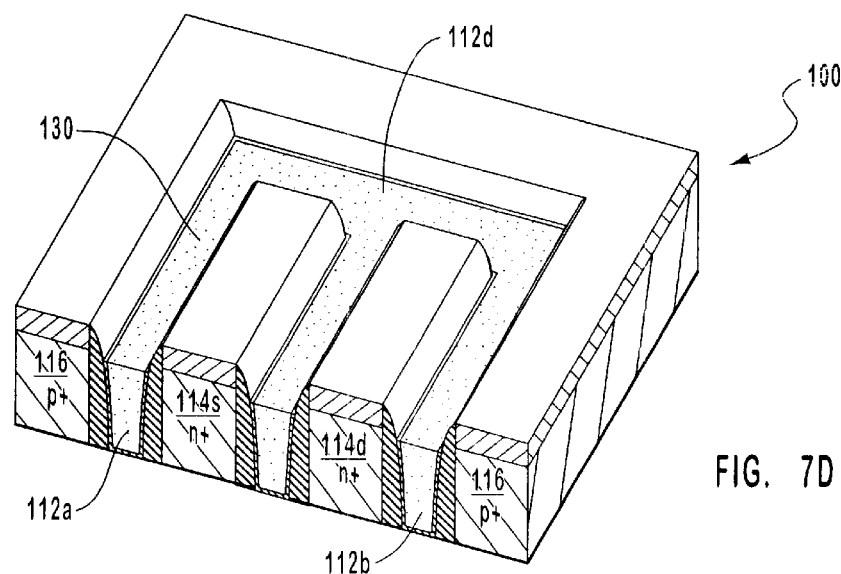
FIG. 7D is an isometric view of the device taken along cutting line 7D after the formation of a first gate conductor layer.
Figure 8A:
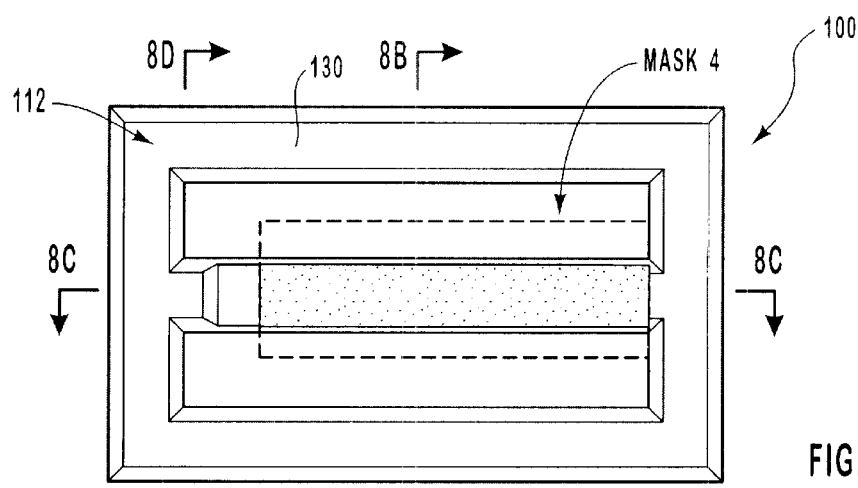
FIG. 8A is a plan view of the device after application of top gate mask (mask 4).
Figure 8B:
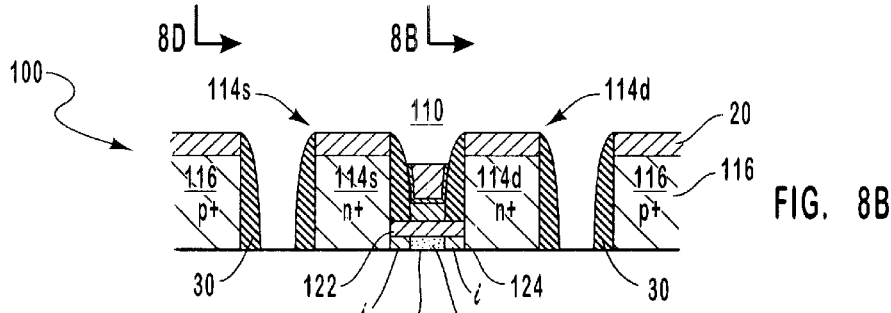
FIG. 8B is a cross sectional view taken along the width of the device after application of top gate mask (mask 4).
Figure 8C:
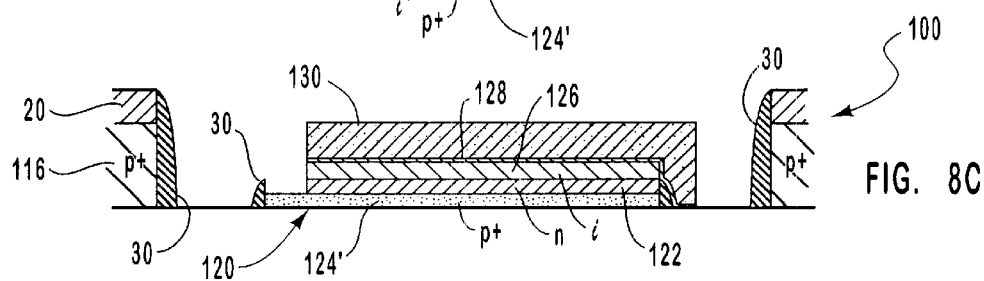
FIG. 8C is a cross sectional view along the length of the device after application of top gate mask (mask 4).
Figure 8D:
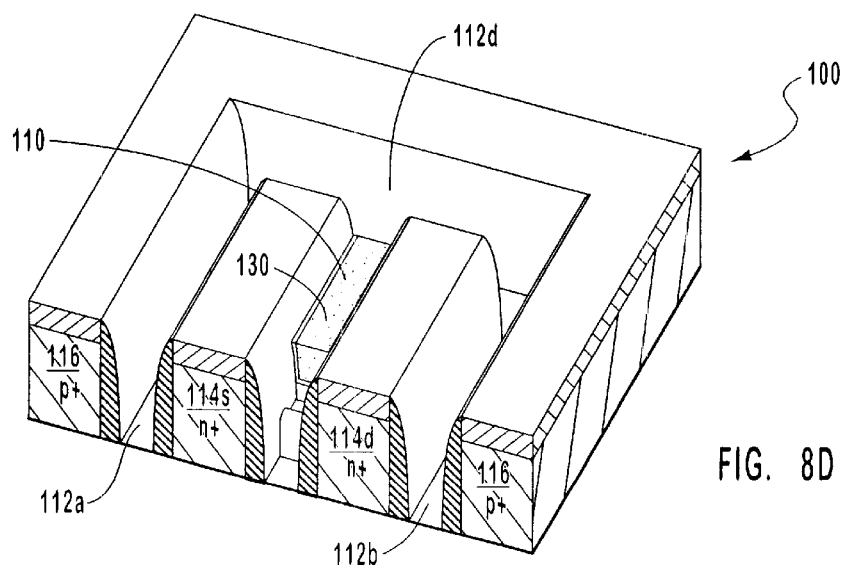
FIG. 8D is an isometric view of the device taken along cutting line 8D after application of top gate mask (mask 4).
Figure 9A:
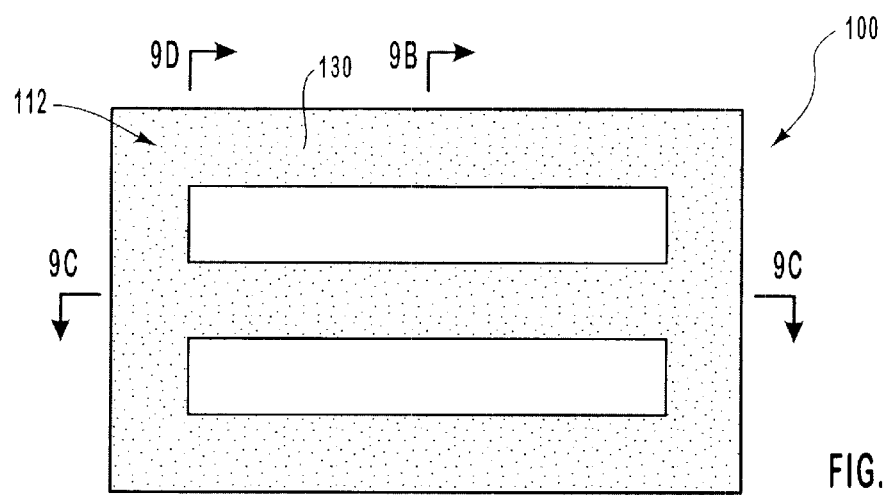
FIG. 9A is a plan view of the device after the trenches have been refilled with isolation dielectric.
Figure 9B:
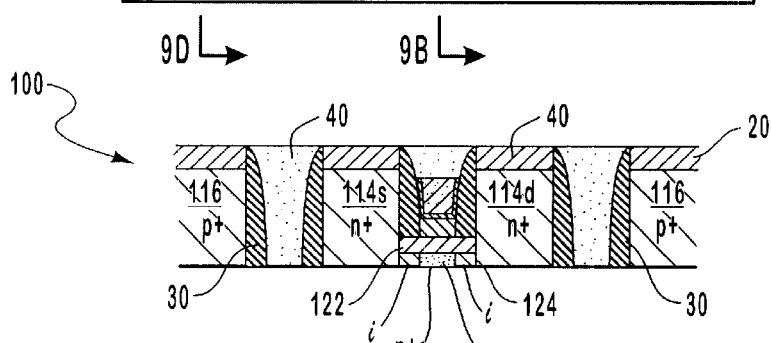
FIG. 9B is a cross sectional view taken along the width of the device after the trenches have been refilled with isolation dielectric.
Figure 9C:
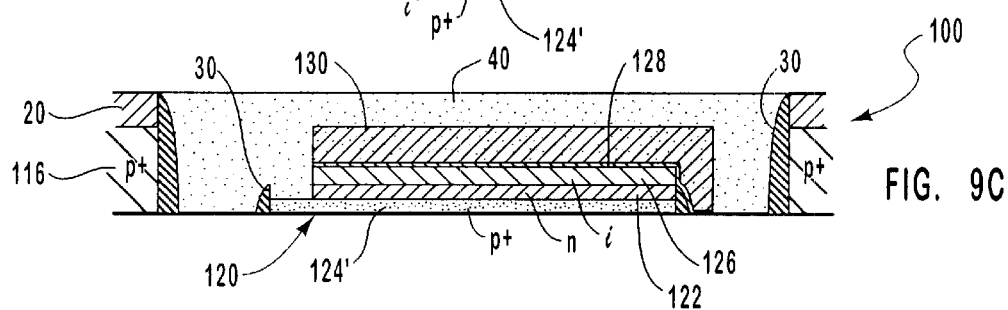
FIG. 9C is a cross sectional view along the length of the device after the trenches have been refilled with isolation dielectric.
Figure 9D:
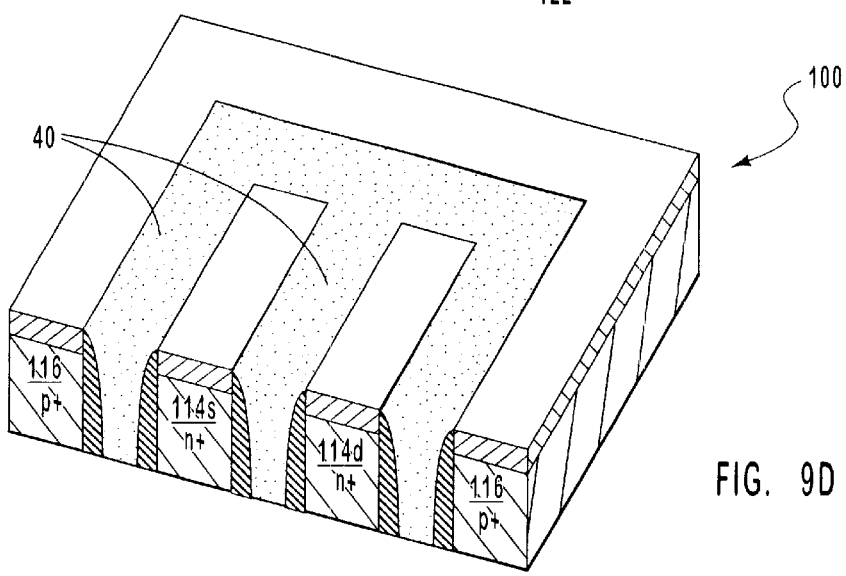
FIG. 9D is an isometric view of the device taken along cutting line 9D after the trenches have been refilled with isolation dielectric.
Figure 10A:
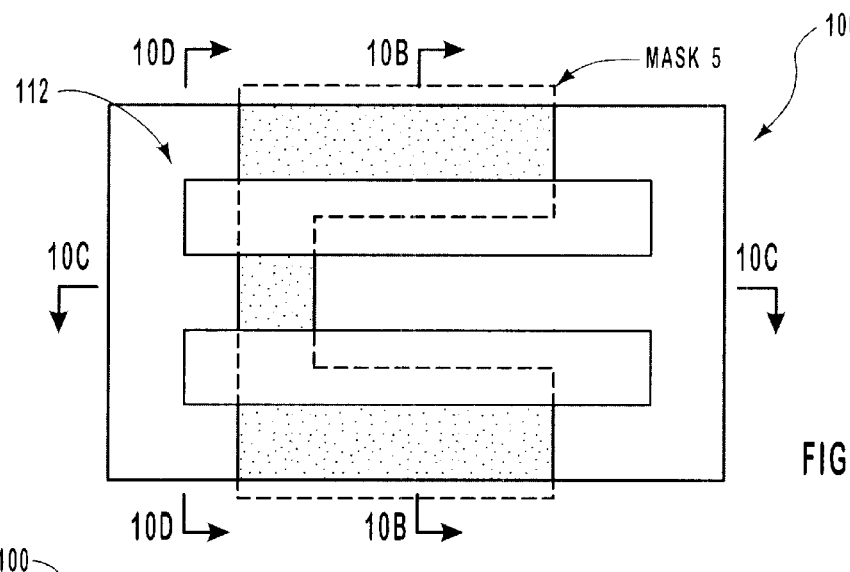
FIG. 10A is a plan view of the device after the isolation dielectric has been patterned by local interconnect mask (mask 5).
Figure 10B:
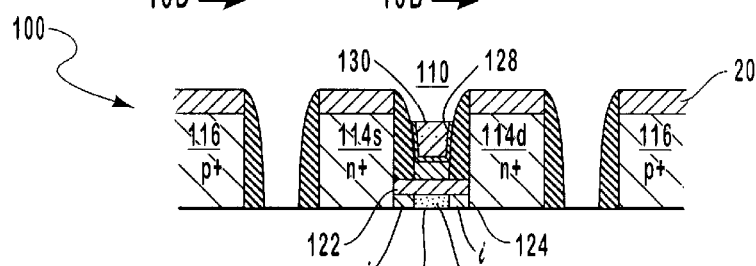
FIG. 10B is a cross sectional view taken along the width of the device after the isolation dielectric has been patterned by local interconnect mask (mask 5).
Figure 10C:
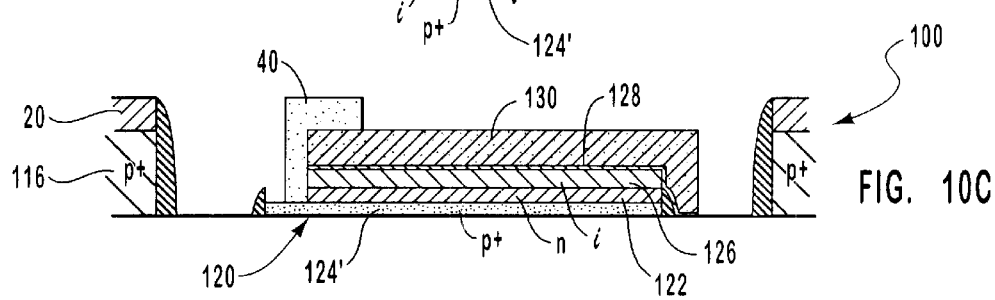
FIG. 10C is a cross sectional view along the length of the device after the isolation dielectric has been patterned by local interconnect mask (mask 5).
Figure 10D:
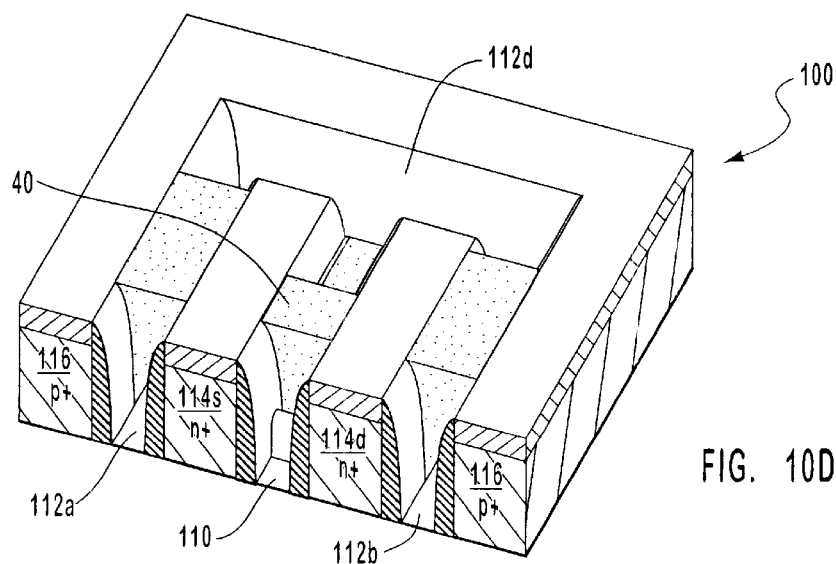
FIG. 10D is an isometric view of the device taken along cutting line 10D after the isolation dielectric has been patterned by local interconnect mask (mask 5).
Figure 11A:
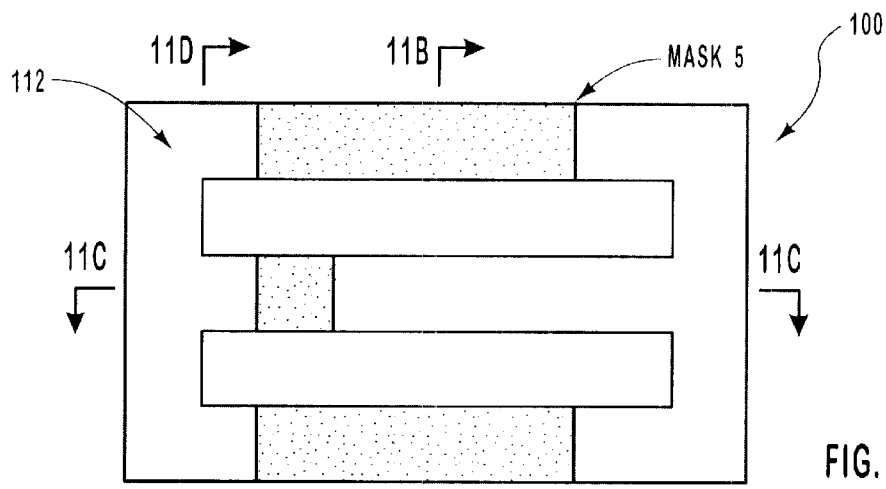
FIG. 11A is a plan view of the device after the gate structure has been completed.
Figure 11B:
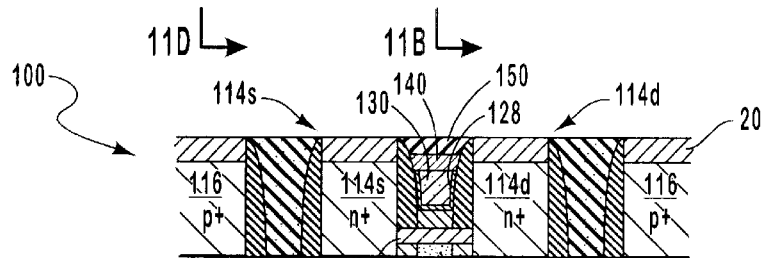
FIG. 11B is a cross sectional view along the width of the device after the gate structure has been completed.
Figure 11C:
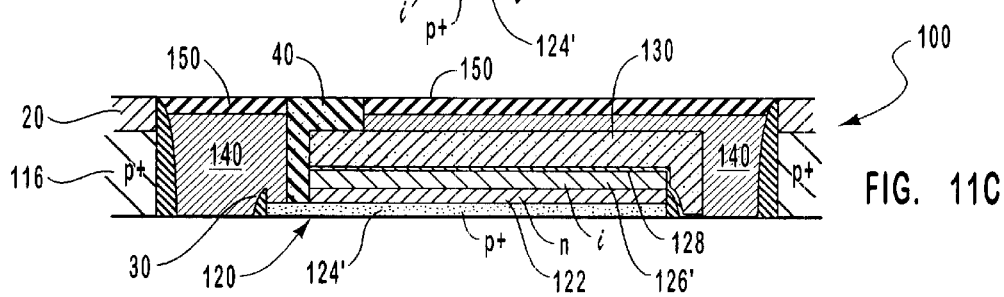
FIG. 11C is a cross sectional view along the length of the device after the gate structure has been completed.
Figure 11D:
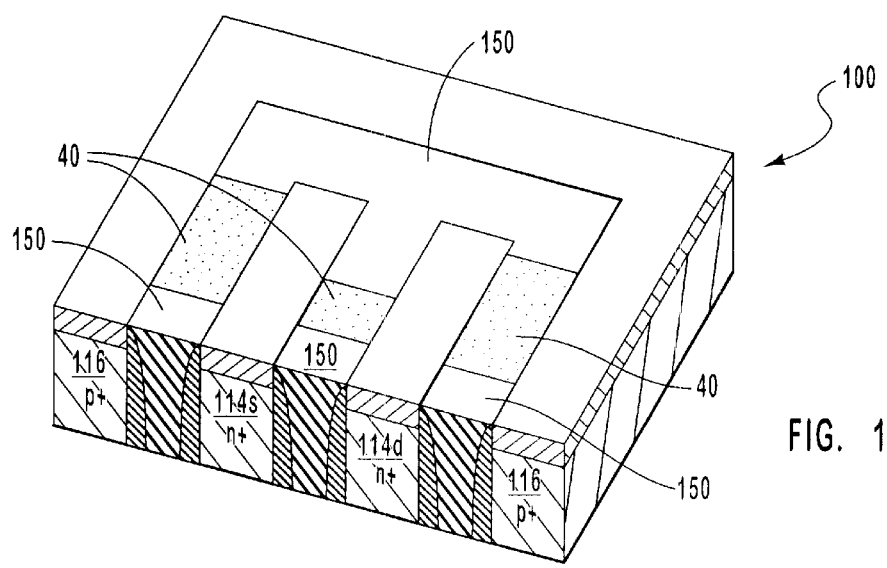
FIG. 11D is an isometric view of the device taken along cutting line 11D after the gate structure has been completed.

First gate conductor layer 130 may be any suitable conductor material that enables the desired threshold voltage. Examples of suitable materials include tungsten, polysilicon, poly-SiGe or a silicide. As shown in FIG. 7D, the trenches 110 and 112 are overfilled with the material that forms the first gate conductor material 130. The materials is then planarized back to the pad 20, and then recessed, preferably by plasma etching, leaving about 50–200 nm of a first gate conductor layer 130 over the channel region 120.

FIGS. 8A–8D shows the results of the top gate mask, identified as mask 4, being applied to the device. The entire channel 110 and gate stack is patterned and etched, stopping on the bottom gate layer 124'. Mask 4 may fully or partially cover the bottom gate mask, which is mask 3. Additionally, mask 4 may be offset to the left or right of the bottom gate mask, simultaneously creating four-terminal as discussed below in reference to FIGS. 14A–B, floating body as discussed below in reference to FIGS. 15A–B, and dynamic threshold devices as discussed below in reference to FIGS. 16A–B. The final device length and width are respectively identified in FIG. 8B at 1 and in FIG. 8C at w.

FIGS. 9A–9D shows the trenches 110 and 112 refilled with isolation dielectric 40. Isolation dielectric is preferably silicon dioxide. After the trenches 110 and 112 have been filled then the isolation dielectric 40 is planarized, as shown.

FIGS. 10A–10D shows isolation dielectric 40 after it has been patterned by the local interconnect (LI or M0) mask identified as mask 5. Mask 5 is used to remove portions of isolation dielectric 40 in the isolation trenches 112.

FIGS. 11A–11D show the completed gate structure. The second gate conductor material is deposited in a manner such that the trench is overfilled. After being overfilled, the second gate conductor material is planarized and then recessed. The second gate conductor material is preferably a metal. The resulting second gate conductor layer 140 serves as a first interconnect or metal level. A first metal level is used to locally wire the bottom and top gates to adjacent circuits and to create a zero-area DTMOS top gate-to-bottom gate connection. A cap 150 is then formed. Cap 150 is formed by refilling recessed top portions of the second gate conductor layer 140 with a dielectric such as silicon dioxide. Cap 150 or capping layer prevents contacts from subsequently shorting to the top of the M0 metal, second gate conductor layer 140.

FIGS. 12A–12D show device 100 following conventional contact and second metal processing. An interlevel dielectric 210 also identified as ILD is deposited, followed by contact patterning and etching through this ILD 210 and through the pad dielectric 20. This etch does not etch the cap 150 or isolation dielectric 40. The contact holes 220 are then filled with metal 222 and planarized, followed by deposition and patterning of second metal 224. Alternatively, Dual Damascene processing could be used for contact and second metal processing.

Figure 12A:
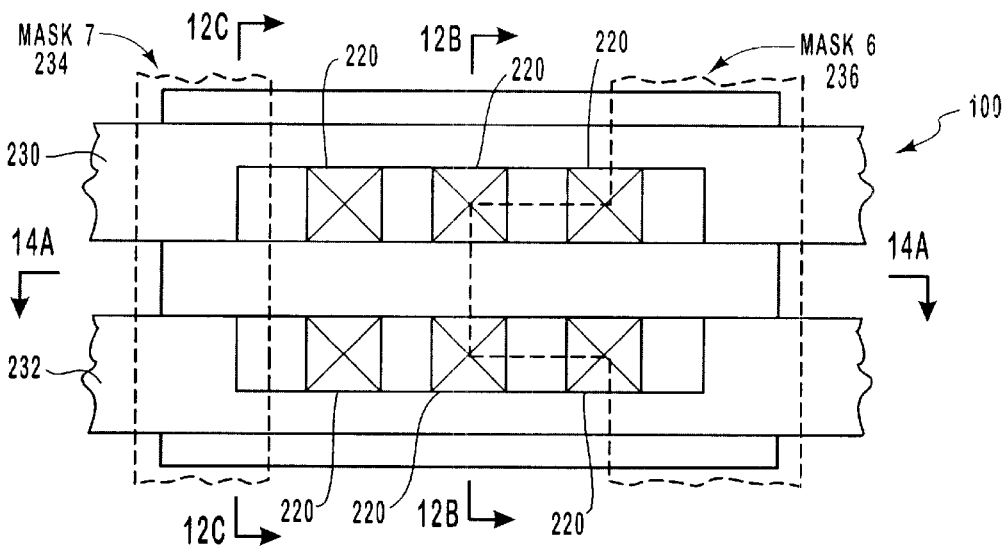
FIG. 12A is a plan view of the device following conventional contact and second metal processing.
Figure 12B:
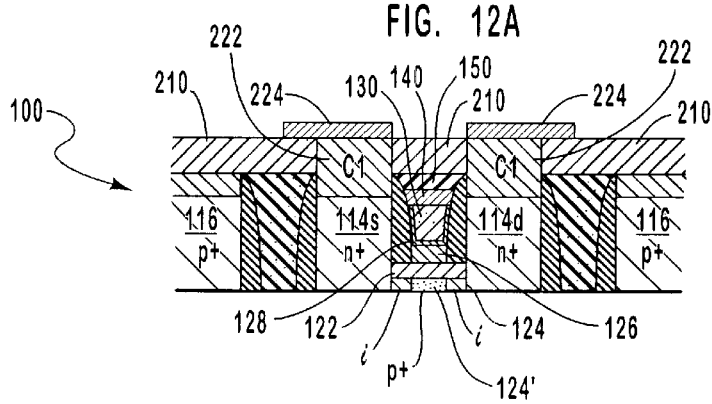
FIG. 12B is a cross sectional view along the width of the device following conventional contact and second metal processing.
Figure 12C:
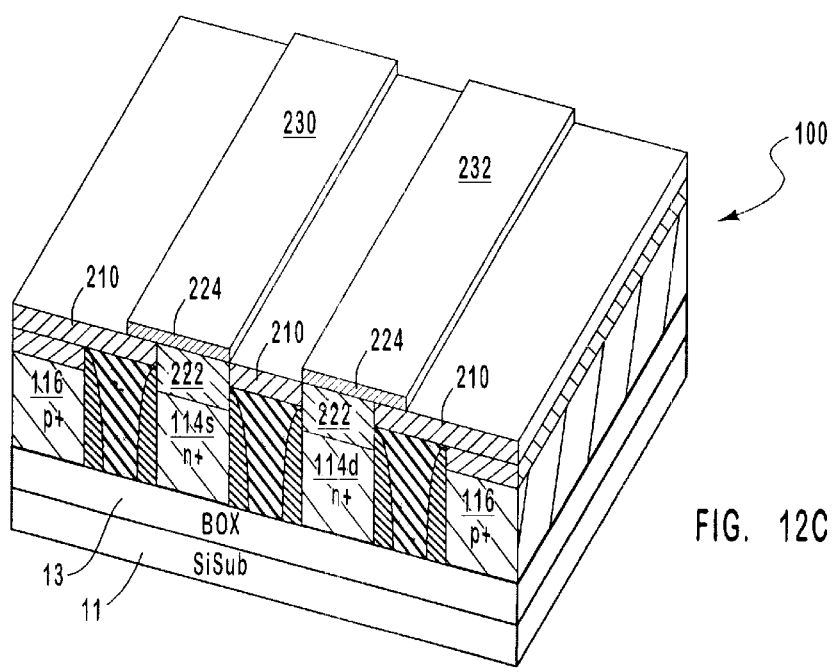
FIG. 12C is cross sectional view along the length of the device following conventional contact and second metal processing.
Figure 13A:
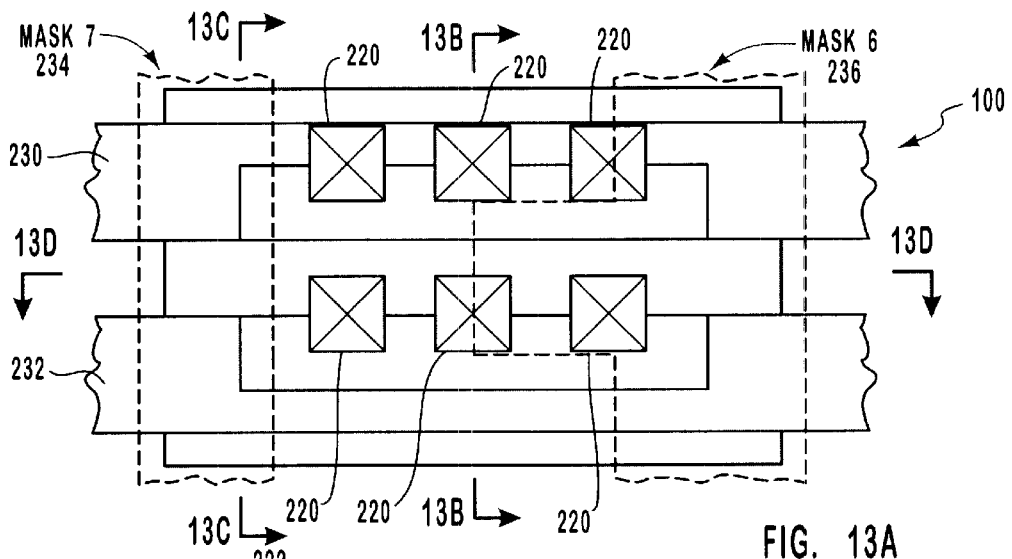
FIG. 13A is a plan view of device with contact holes misaligned.
Figure 13B:
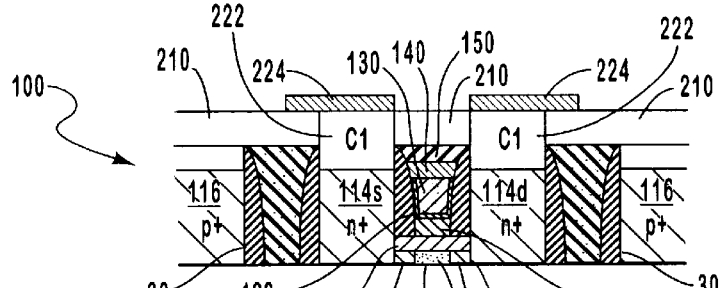
FIG. 13B is a cross sectional view along the width of the device with contact holes misaligned.
Figure 13C:
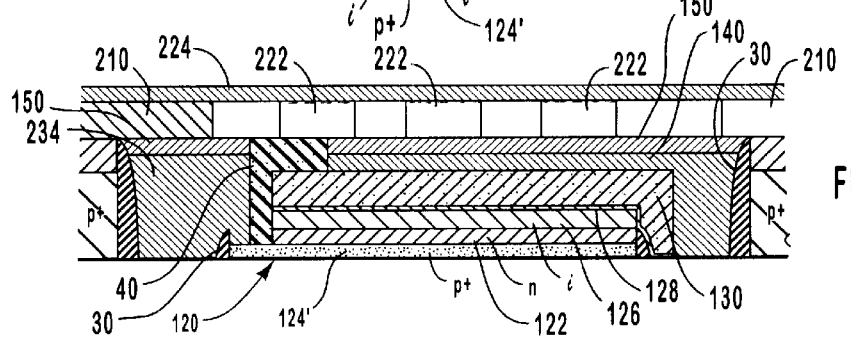
FIG. 13C is a cross sectional view along the length of the device with contact holes misaligned.
Figure 13D:
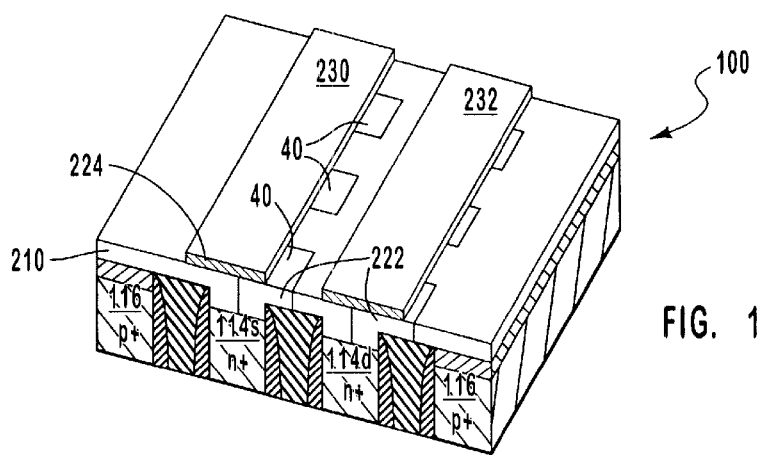
FIG. 13D is an isometric view of the device taken along cutting line 13D with contact holes misaligned.

FIGS. 12A–C shows the final completed device structure in a four-terminal configuration where the bottom gate is wired out to the left and the top gate is wired out to the K right, the source is wire to the bottom and the drain is wire to the top. This configuration enables all four terminals 230, 232, 234 and 236 to be biased independently.

FIGS. 13A–13D show that even if contact holes 220 are misaligned the contact holes still provide a via between the second level of metal 224 and the pedestals 114s or 114d. Shorting is avoided as there is no connection to second gate conductor layer 140, metal M0, due to the isolating configuration of cap 150.

FIG. 14A is identical to FIG. 12B and is included for convenient comparison with 9 FIG. 14B which schematically depict the four terminal connections of the device. Note that the configuration shown in FIGS. 14A and 12B is enabled through the offset positioning of masks 3 and 4.

FIG. 15A shows the floating body configuration of this device, where the bottom gate is electrically isolated by the spacers and gate dielectric from the top gate or MO. Top gate encloses the bottom gate due to the use of top gate mask that is larger than the bottom gate mask. FIG. 15B schematically depicts the terminal connections of the device. Note that the contact 41) hole 220 configuration depicted in FIGS. 15A and 16A are shown due to possible misalignment of the contact holes 220. These contact holes 220 are not visible in the cross-sectional view when properly aligned as shown in FIG. 14A. While alignment is preferred, the process disclosed herein enables contact holes to be misaligned and still function without shorting to metal layer 130.

FIG. 16B shows the dynamic threshold (DTMOS) configuration of this device, where the top and bottom gates are shorted at both the left and right sides of the channel. However, FIG. 16A shows only the left side being shorted. Of course, the right side would appear symetrical to the left side for an embodiment corresponding with the schematic depicted in FIG 16B. Bottom gate encloses the top gate due to the use of a bottom gate mask that is larger than the top gate mask. As indicated above, FIG. 16B schematically depict the terminal connections of the device with the top gate shorted to the bottom gate.

FIGS. 17–24 depict another embodiment for forming a Damascene double gate transistor. FIG. 17A depicts a substrate like that shown in FIG. 2B with a pad 20 on substrate 10". In contrast to the embodiment described above in reference to FIGS. 2–12, the source/drain implants are formed before etching the trenches. The doping may be followed by rapid thermal activation. The depth of these top-side junctions can be adjusted as needed for subsequent silicidation and sheet resistance, without impacting the short-channel behavior of the device. Since these source and drain regions will effectively be "raised" with respect to the channel, they may be made thicker and lower in resistance than typical CMOS processes.

Figure 17A:
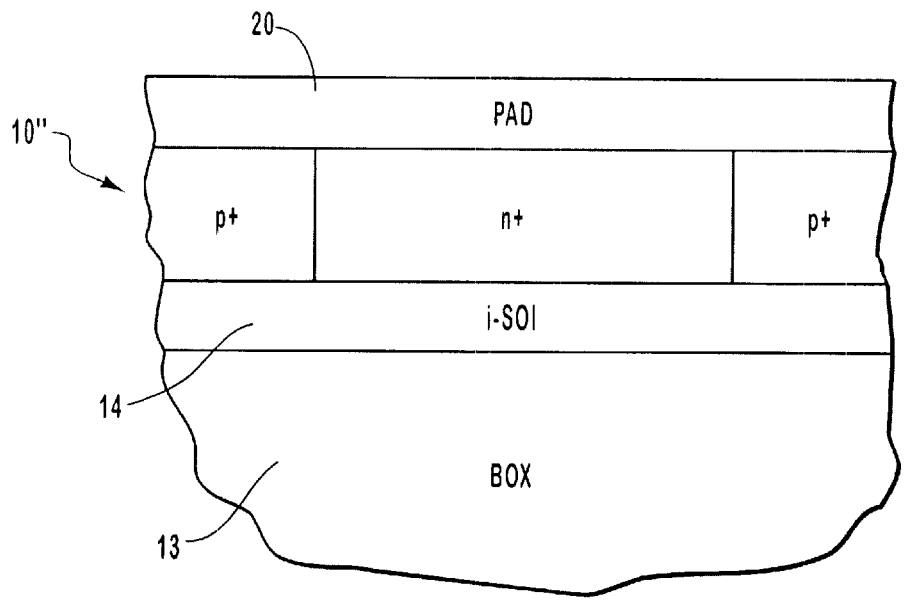
FIG. 17A depicts a cross sectional view of substrate of embodiment 100".
Figure 17B:
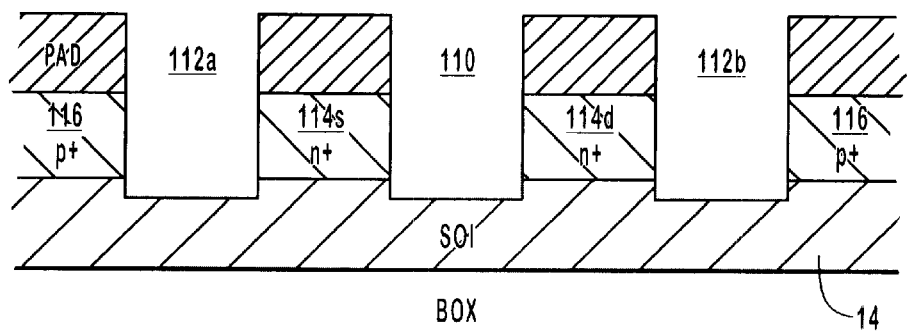
FIG. 17B and FIG. 18 are cross sectional views depicting embodiment 100" before and after etching.

FIG. 17B depicts device 100" after gate trench 110 and isolation trench 112 have been formed. This first photolithography level defines the source and drain regions of the device. The etching is preferably a silicon plasma etch. About 100 nm of SOI film is preferably left under these trenches, as shown in the sideview in FIG. 17B.

Figure 18:
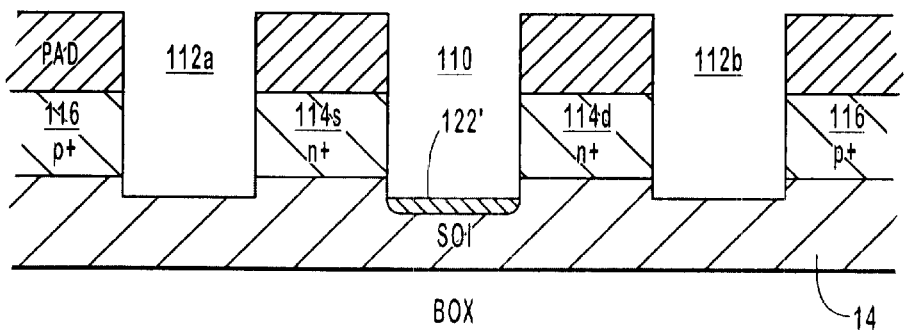

FIG. 18 shows the formation of a doped channel layer or portion 122'. Doped channel layer 122' may be formed by any suitable method. For example, layer 122 may be formed through the use of large angle tilted implantation or alternatively through the use of dummy doping with a sacrificial layer that is subsequently removed. Preferably, complementary high-dose, low-energy, large-angle-tilted ion implants are performed to form the trench sidewall and bottom S/D junctions. Indium can be used for P-channel and arsenic for N-channel devices, followed by rapid thermal activation. Sidewall junctions are preferably made shallow to control short channel effects. An optional thin sacrificial oxide can be performed to remove any plasma etch or implantation damage from the bottom of the trench where the channel will be and to prevent any stress damage from the coming nitride sidewall spacers 30.

Figure 19A:
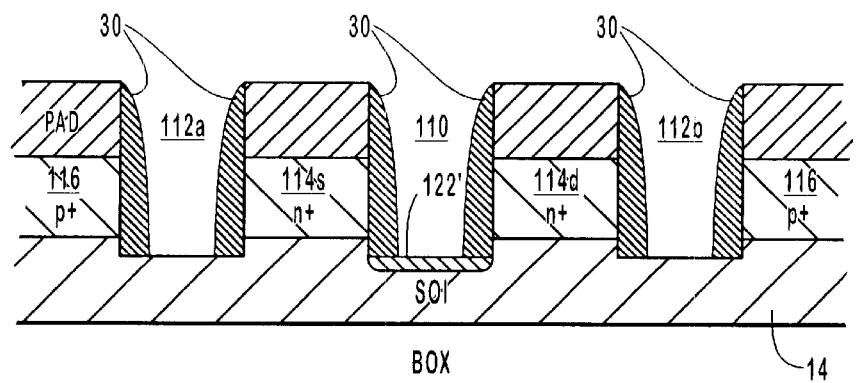
FIG. 19A depicts a cross sectional view of the device after completion of the step of depositing and etching sidewall spacer for embodiment 100".
Figure 19B:
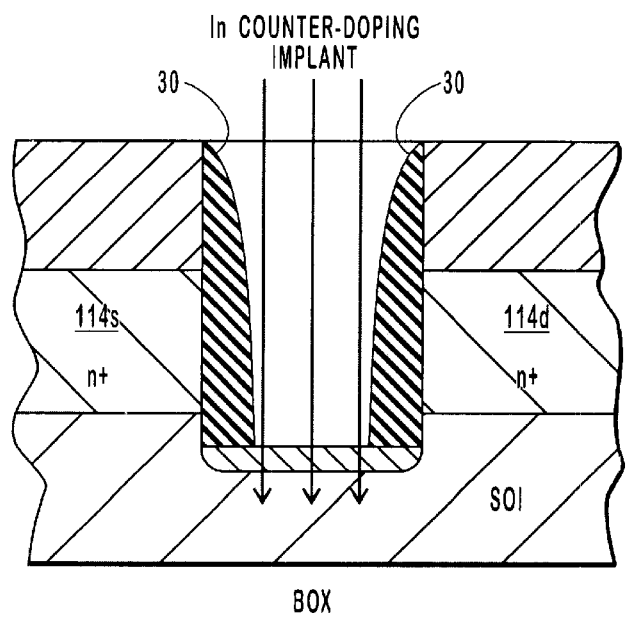
FIG. 19B depicts a cross sectional view of the device after completion of the step of directing complementary, counter-doping ion implants for embodiment 100".
Figure 19C:
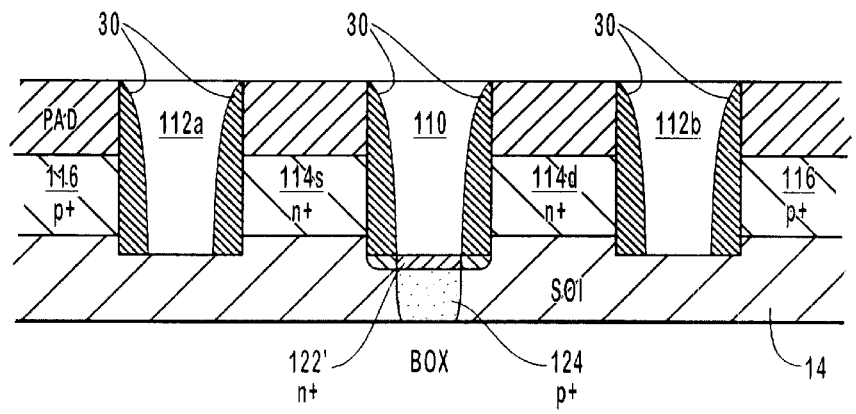
FIG. 19C depicts a cross sectional view of the device after the step of directing complementary, counter-doping ion implants for embodiment 100".

As shown in FIG. 19A, nitride sidewall spacers 30 are then deposited and etched, providing an opportunity for optional halo (not shown) and S/D extension implants before and/or after the spacer formation. Nitride sidewall spacers 30 are preferably about 20 nm thick. Spacers 30 also protect the S/D regions from subsequent shorting to the gate during the gate to body contact process. Anisotropic etching may be used to remove the $Si_3N_4$ from the top surface and the bottom of the gate. As shown in FIG. 19B, complementary, counter-doping ion implants are preferably then directed into the open bottom of gate trench 110 between the sidewall spacers 30. These high-dose, higher-energy implants (preferably indium for N-channel and preferably arsenic for P-channel) compensate the previous shallow S/D implants, resulting in low net doping down into the body in a range of about 30 nm to about 50 nm where the inversion channel will be located, with a hyper-abrupt transition to high concentration in the bottom portion of the body where the body contact will be formed and body current conducted. The resulting configuration is shown in FIG. 19C with the p+ region indicated at 124'. The resulting heavily doped body "stripe" is self-aligned to the future gate "stripe" directly above it but not underneath the S/D regions, thus minimizing capacitance. These implants are rapid thermal annealed and the sacrificial oxide is removed from the trench bottoms. Note that the rapid thermal annealing is the last high temperature step in the process. The counter-doping can be achieved by doping from ion implantation with or without tilt for symmetrical or asymmetrical structures. Counterdoping can also be achieved through solid source doping from a sacrificial layer.

Figure 25B:
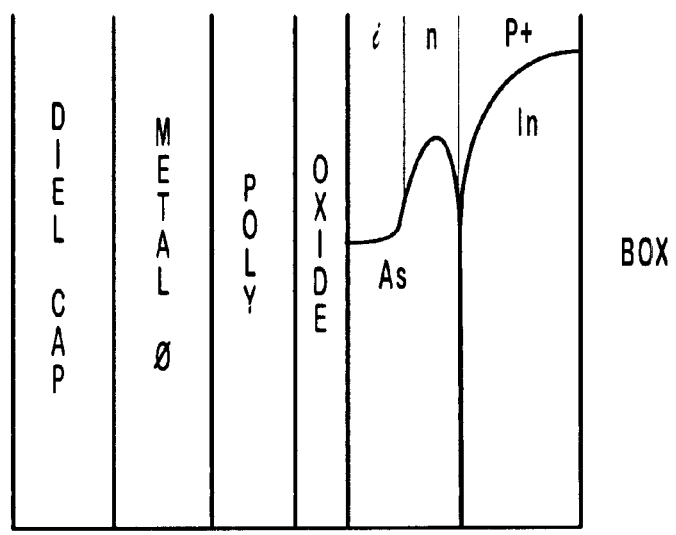
FIG. 25B depicts the doping profile in the channel and body/well of embodiment shown in FIG. 25A.

As previously indicated, the implant is preferably indium for the N-channel and preferably arsenic for the P-channel devices. The resulting doping profile in the channel and body/well is shown in FIG. 25B, as discussed below. Advantages of the hyper-abrupt retrograde profile below the channel achieved through the critical body counter-doping ion implantation are explained below after the overall method has been fully set forth.

Figure 20:
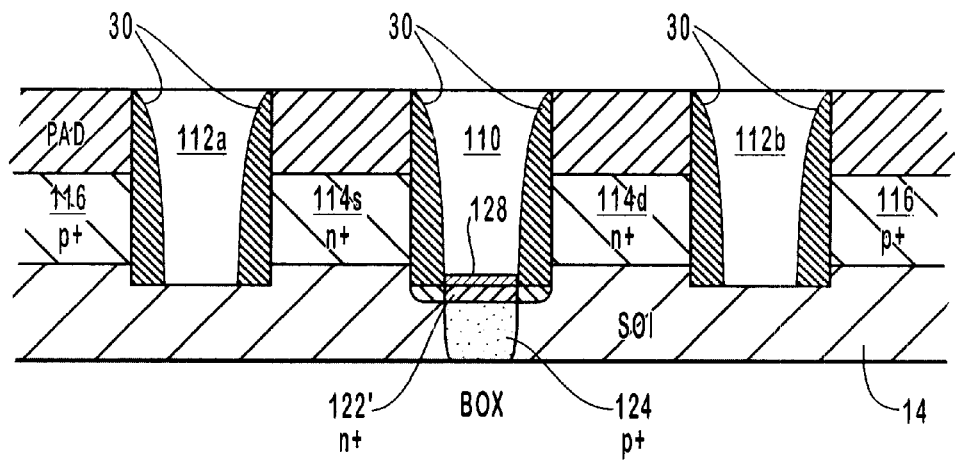
FIG. 20 depicts a cross sectional view of the device after the step of depositing a gate dielectric for embodiment 100".

Next a gate dielectric 128 is deposited as shown in FIG. 20. Any appropriate gate dielectric may be used including temperature-sensitive high-k dielectrics such as hafnium oxide. Deposition of the gate dielectric is followed by a trench-filling deposition of the first gate conductor material 130. First gate conductor material 130 is preferably either doped or undoped polysilicon or a polysilicon-germanium alloy where the percent germanium content is used to adjust the gate workfunction and therefore the device threshold voltage. First gate conductor material 130 may also be a metal such as tungsten or titanium nitride. Chemical-mechanical polish (CMP) of this layer back to the pad then follows.

Figure 21:
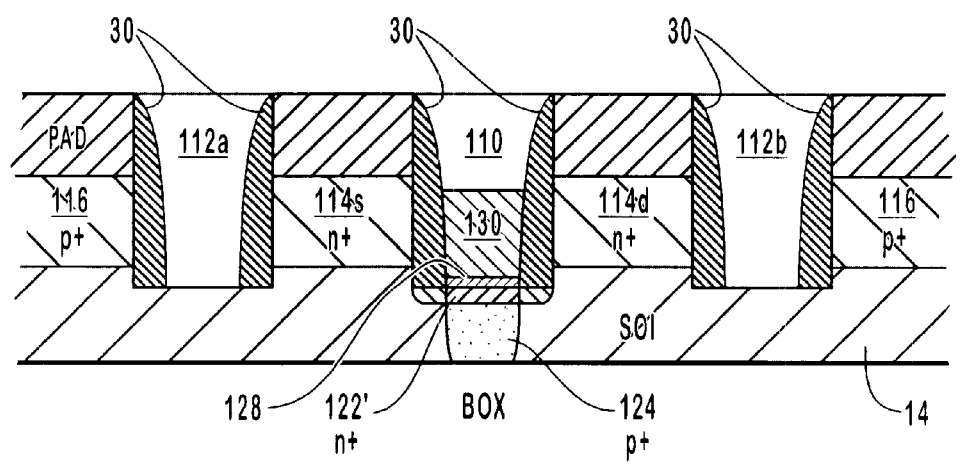
FIG. 21 depicts a cross sectional view of the device after the step of plasma etching first gate conductor for embodiment 100".

First gate conductor material 130 is plasma-etch recessed to about 30 nm in the trench bottom, followed by an optional temporary oxide trench fill deposition and CMP, as shown in FIG. 21.

Figure 22A:
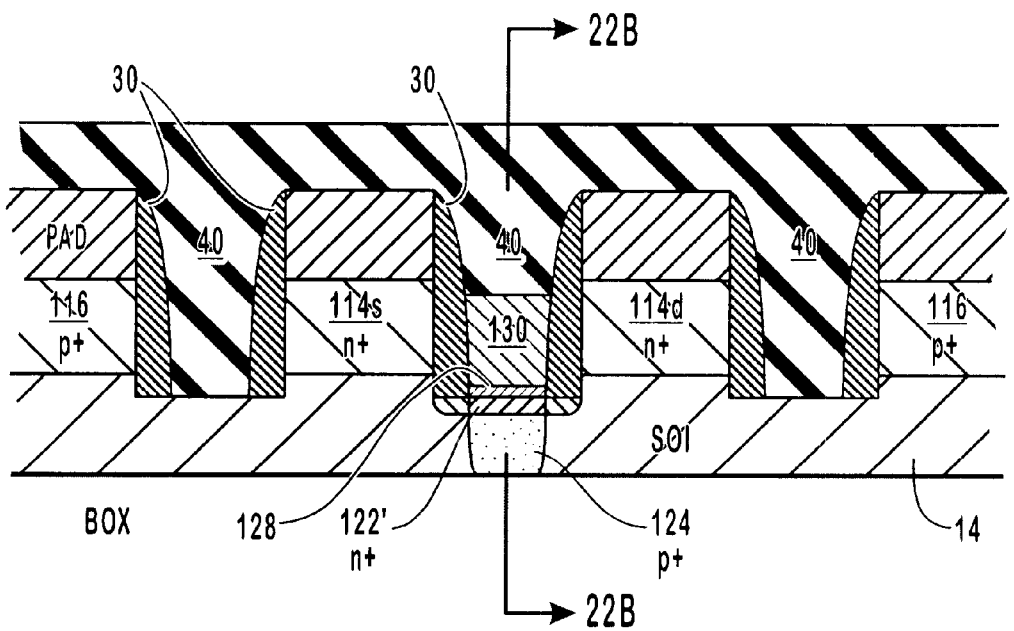
FIG. 22A depicts a cross sectional view along the width of the device after the step of filling isolation trenches along the channel length direction of embodiment 100".
Figure 22B:
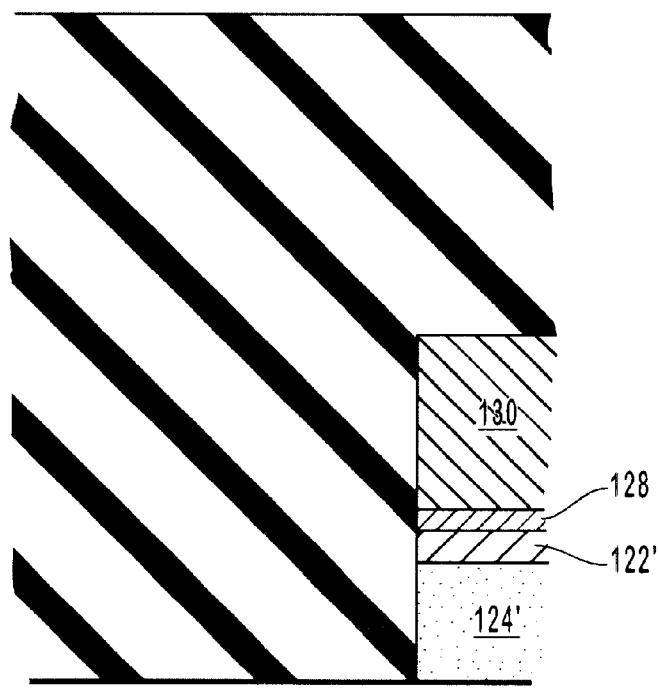
FIG. 22B depicts a cross sectional view along the length of the device the step of filling isolation trenches along the channel width direction of embodiment 100".

Isolation trenches 112 are then filled with oxide 40, as is the region above first gate conductor material 130, and planarized back to nitride pad 20, resulting in the sideviews shown in FIG. 22A. FIG. 22A depicts the channel length direction, while FIG. 22B shows the channel width direction, including the endwall where the first gate conductor material 130 will be shorted to the retrograde body implant 122 by the upcoming second gate conductor material 140.

Next, M0 (first level, local interconnect) lithography is performed utilizing photoresists PR, followed by etching a trench through oxide 40 to the bottom of the STI and trench cap oxides at the same time all the way to BOX layer 14 when the substrate is the SOI embodiment, substrate 10"). FIGS. 23A–23B depict the resulting configuration in views that are respectively, the channel length direction and the channel width direction. FIG. 23B depicts the removal of oxide 40 down to BOX layer 13. FIG. 23A depicts the removal down to first gate conductor material 130. This M0 trench is filled with the second gate material 140 (by deposition of a low-resistance metal such as copper or other suitable material, and then planarizing by a process such as CMP. Second gate material 140 is positioned to short the top and ends of the first gate conductor material 130 to the buried heavily doped body at both endwalls of the device, but does not short to the S/D implants due to the protecting nitride sidewall spacers. This second gate conductor material 140 is plasma recessed to a thickness of about 30 nm and then capped with an oxide fill 150 and then planarized. The resulting final transistor structure is completely planar, as shown in FIG. 24A. The zero-area, zero-capacitance endwall gate-body DTMOS connection is identified in FIG. 24B at 70.

A standard CMOS multi-level, dual-Damascene metal interconnect process is then completed, like that shown in FIGS. 12A–12D. Notice that the spacing of S/D metal contacts to the gate and to each other is reduced compared to prior art device. This condensed configuration increases layout density without causing S/D to gate shorts due to the tolerance of the structure to misalignment. These contacts can be "borderless" since they are self-aligned to the gate cap insulator. This improves the density of memory cells such as compact DRAM, SRAM, and FLASH cell designs.

Advantages of the unique connection structure and the hyper-abrupt retrograde well are described below. Other advantages of the method disclosed above should also be appreciated. Most DTMOS processes have included a typical plasma-etched polysilicon gate process, which leads a gate stack that is highly non-planar and has high resistance. Such processes also result in depletion of the poly gate and boron penetration through the gate dielectric. Further such processes result in incompatibility with high temperature intolerant gate stack materials due to the source/drain implant thermal processing, which usually follows the gate formation. Due to this sequence, such me processes. Such processes involve building a dummy poly gate and sidewall spacers, performing all S/D implants and anneals, planarizing the structure with a CMP polish insulator, removing the dummy gate, depositing a high k gate dielectric and a low resistance gate metal, and then planarizing the surface to leave a Damascene metal gate in the groove where the dummy poly gate had been. Disadvantages of such process include a high S/D resistance due to shallow S/D junctions or the S/D contacts being non self-aligned to the gate. The first problem is particularly relevant to sub-100 nm devices and the second problem is particularly relevant to compact DRAM, SRAM and FLASH cells. In contrast, the present invention is a Damascene metal "gate last" process that results in effectively raised source/drain regions for reduced S/D resistance. The inventive process also provides self-aligned, borderless S/D contacts that will not short the gate even with a complete overlap.

Another advantage of the inventive method is the elimination of the wells typically formed bulk silicon by conventional implementations of DTMOS. Current DTMOS implementations require a "triple-well" structure with a shallow N-well, shallow P-well and a deep N-well to isolate individual body nodes from each other. The present method eliminates this well processing and is accordingly referred to as "Well-less CMOS". The well-less CMOS methodology results in sufficient isolation by using high resistivity epitaxial isolation coupled with sub-volt biases and optional VDD/2 epi substrate bias. The novel bulk silicon "semi-insulating" substrate design will also decrease the cross-talk, noise coupling, and passive component Q losses typical of existing bulk CMOS processes.

FIG. 25A is a side view of a transistor that has a counter doped region that was formed by a different method than that set forth above in relation to FIGS. 17–24. The surface of the substrate is first doped and the trench is formed on top of the substrate by depositing the insulative material around a dummy material that is subsequently removed. After removal of the dummy material then the spacers are deposited in preparation for counter-doping the bottom of the trench. After the counter-doping has been achieved then the subsequently layers can be deposited. Note that selective epitaxy, counter-doping, and indium/arsenide retrograde doping of the body region below the channel have all been proposed/demonstrated in order to achieve a hyper-abrupt retrograde well profile such as the so called "Super Steep Retrograde (SSR) and Delta-Doped (DD) profiles that will optimize/maximize the body effect, while at the same time providing a buried low-resistance body path. However, these reported methods cause excessive junction capacitance and/or leakage when the retrograde well extends under the source/grading (S/D) junctions (in bulk CMOS) or butts against them in SOI CMOS). The novel hyper-abrupt retrograde well structure formed by counter-doping a preexisting S/D implant only in and below the channel region, enables the channel to be self-aligned and prevents contacts with the source/drain junctions. Such novel structures are especially beneficial to bulk silicon implementations as it achieves most of the benefits of SOI DTMOS implementations.

As mentioned above, FIG. 25B illustrates the hyper-retrograde doping profile achieved in the substrate and the depth of the different layers of the transistor above the counter-doped region. FIG. 25B is shown as depicting the profile for the device shown in FIG. 25A, however, the same profile results for the devices shown in FIGS. 11B and 24A.

It will be obvious to those having skill in the art that many changes may be made to the details of the above-described embodiments of this invention without departing from the underlying principles thereof. The scope of the present invention should, therefore, be determined only by the following claims.

What is claimed is:

1. A Damascene double gated, recessed channel transistor comprising
   an extrinsic region around an intrinsic region,
      wherein the intrinsic region includes a plurality of layers in a trench in a semiconductor substrate, wherein the trench includes a merged gate trench and isolation trench, wherein the extrinsic region includes a source pedestal and a drain pedestal, wherein the gate trench is between the source pedestal and the drain pedestal, wherein the isolation trench is dielectrically filled and surrounds the source pedestal and the drain pedestal,
      wherein the plurality of layers are self-aligned to the trench,
      wherein the layers provide a double gated MOSFET, wherein the double gated MOSFET includes a top gate, a gate dielectric, a channel and a bottom gate, and wherein the top gate is over the gate dielectric, the gate dielectric is over the channel and the channel is over the bottom gate.

2. A transistor as defined in claim 1, wherein the substrate is a Silicon-On-Insulator including a buried insulator between silicon layers.

3. A transistor as defined in claim 1, wherein the substrate is selected from the group consisting of bulk silicon, epitaxial layer on bulk silicon, and epitaxial layer on Silicon-On-Insulator.

4. A transistor as defined in claim 1, wherein the trench has walls that are lined with insulating sidewall spacers.

5. A transistor as defined in claim 4, wherein the double gated MOSFET is defined by an opening between the insulating sidewall spacers such that the double gated MOSFET has a sublithographic channel length.

6. A transistor as defined in claim 1, wherein the bottom gate is formed by heavily doping the substrate at the bottom of the trench.

7. A transistor as defined in claim 1, wherein the channel is a material selected from the group consisting of an epitaxial layer grown on the bottom gate and a region of the substrate remaining above a heavily doped region of the substrate that is the bottom gate.

8. A transistor as defined in claims 1, wherein the substrate has been doped to a first polarity, and wherein the channel is then counterdoped to an opposite polarity to achieve a hyper-retrograde channel doping profile.

9. A transistor as defined in claim 1, wherein the gate dielectric is selected from the group consisting of temperature sensistive dielectrics and dielectrics that are not temperature sensitive.

10. A transistor as defined in claim 1, wherein the top gate is selected from the group consisting of temperature sensistive conductors and conductors that are not temperature sensitive.

11. A transistor as defined in claim 8, wherein the layers include a conducting layer over the double gated MOSFET that functions as a local interconnect, and wherein the conducting layer is electrically connected to at least one gate of the double gated MOSFET.

12. A transistor as defined in claim 11, wherein the top gate is electrically connected to the conducting layer to provide a terminal connection and the bottom gate is electrically connected to the conducting layer to provide another terminal connection such that the transistor has four terminals.

13. A transistor as defined in claim 11, wherein the top gate is electrically connected to the conducting layer to provide a terminal connection and the bottom gate is isolated such that the transistor has a floating bottom gate and has three terminals.

14. A transistor as defined in claim 11, wherein the top gate layer is electrically connected to the conducting layer which is also electrically connected to the bottom gate such that the transistor has a dynamic threshold (DTMOS) configuration with three terminals resulting in low power dissipation.

15. A transistor as defined in claim 1, wherein the layers include an insulating cap, the insultating cap being over a conducting layer that functions as a local interconnect, the conducting layer being over the double gated MOSFET.

16. A transistor as defined in claim 15, wherein the extrinsic region includes a source pedestal and a drain pedestal, wherein the transistor includes source/drain contacts holes filled with a metal that contacts the source and drain pedestals, and wherein the insulating cap prevents the metal in the contact holes from shorting to the double gated MOSFET regardless of alignment of the contact holes with the pedestals.

17. A transistor as defined in claim 1, wherein the extrinsic region includes a source pedestal and a drain pedestal, wherein the source pedestal, the drain pedestal and the channel have been simultaneously doped with deep and shallow complementary ion implants.

18. A transistor as defined in claim 1, wherein the extrinsic region includes a source pedestal and a drain pedestal that are relatively taller and wider than the channel.

19. A Damascene double gated, recessed channel transistor comprising an extrinsic region around an intrinsic region,
wherein the intrinsic region includes a plurality of layers in a trench in a semiconductor substrate, wherein the trench includes a merged gate trench and isolation trench, wherein the extrinsic region includes a source pedestal and a drain pedestal, wherein the gate trench is between the source pedestal and the drain pedestal, wherein the isolation trench is dielectrically filled and surrounds the source pedestal and the drain pedestal,
wherein the plurality of layers are self-aligned to the trench,
wherein the layers provide a double gated MOSFET, wherein the double gated MOSFET includes a top gate, a gate dielectric, a channel and a bottom gate, and wherein the top gate is over the gate dielectric, the gate dielectric is over the channel and the channel is over the bottom gate, and
wherein the transistor is formed in the substrate and is entirely planar to a top surface of a thin layer on the substrate.

20. A Damascene double gated, recessed channel transistor comprising an extrinsic region around an intrinsic region,
wherein the intrinsic region includes a plurality of layers in a trench in a semiconductor substrate, wherein the trench includes a merged gate trench and isolation trench, wherein the extrinsic region includes a source pedestal and a drain pedestal, wherein the gate trench is between the source pedestal and the drain pedestal, wherein the isolation trench is dielectrically filled and surrounds the source pedestal and the drain pedestal,
wherein the plurality of layers are self aligned to the trench,
wherein the layers provide a double gated MOSFET, wherein the double gated MOSFET includes a top gate, a gate dielectric, a channel and a bottom gate, and wherein the top gate is over the gate dielectric, the gate dielectric is over the channel and the channel is over the bottom gate,
wherein the extrinsic region includes a source pedestal and a drain pedestal that are thicker and wider than the channel.

21. A Damascene double gated, recessed channel transistor comprising an extrinsic region around an intrinsic region,
wherein the intrinsic region includes a plurality of layers in a trench in a semiconductor substrate, wherein the trench includes a merged gate trench and isolation trench, wherein the extrinsic region includes a source pedestal and a drain pedestal, wherein the gate trench is between the source pedestal and the drain pedestal, wherein the isolation trench is dielectrically filled and surrounds the source pedestal and the drain pedestal,
wherein the plurality of layers are self-aligned to the trench, wherein the layers provide a double gated MOSFET,
 wherein the double gated MOSFET includes a top gate, a gate dielectric, a channel and a bottom gate, and wherein the top gate is over the gate dielectric, the gate dielectric is over the channel and the channel is over the bottom gate,
 wherein the plurality of layers include a conducting layer over the double gated MOSFET that functions as a local interconnect and an insulating cap over the conducting layer,
 wherein the transistor includes source/drain contact holes filled with a metal that contacts the source and drain pedestals, and wherein the insulating cap prevents the metal in the contact holes from shorting to the double gated MOSFET regardless of alignment of the contact holes with the pedestals, thereby enabling the contact holes to be over the trench to yield a compact transistor.

22. An integrated circuit comprising
a plurality of transistors
 wherein each transistor has an extrinsic region around an intrinsic region,
  wherein the intrinsic region includes a plurality of layers in a trench in a semiconductor substrate, wherein the trench includes a merged gate trench and isolation trench, wherein the extrinsic region includes a source pedestal and a drain pedestal, wherein the gate trench is between the source pedestal and the drain pedestal, wherein the isolation trench is dielectrically filled and surrounds the source pedestal and the drain pedestal,
  wherein the plurality of layers are self-aligned to the trench,
  wherein the layers provide a double gated MOSFET,
   wherein the double gated MOSFET includes a top gate, a channel and a bottom gate, wherein the top gate is over the channel and wherein the channel is over the bottom gate,
   wherein the plurality of layers include a conducting layer over the double gated MOSFET that functions as a local interconnect, and wherein the conducting layer is electrically connected to at least one gate layer.

23. A Damascene double gated, recessed channel transistor comprising
 an extrinsic region around an intrinsic region,
  wherein the intrinsic region includes a plurality of layers in a trench in a semiconductor substrate, wherein the trench includes a merged gate trench and isolation trench, wherein the extrinsic region includes a source pedestal and a drain pedestal, wherein the gate trench is between the source pedestal and the drain pedestal, wherein the isolation trench is dielectrically filled and surrounds the source pedestal and the drain pedestal,
  wherein the plurality of layers are self-aligned to the trench,
  wherein the layers provide a double gated MOSFET,
   wherein the double gated MOSFET includes a top gate, a channel and a bottom gate, wherein the top gate is over the channel and wherein the channel is over the bottom gate,
  wherein the plurality of layers include a conducting layer over the double gated MOSFET that functions as a local interconnect, and wherein the conducting layer is electrically connected to at least one gate layer.

24. A transistor as defined in claim 23, wherein the top gate layer is electrically connected to the conducting layer to provide a terminal connection and the bottom gate layer is electrically connected to the conducting layer to provide another terminal connection such that the transistor has four terminals.

25. A transistor as defined in claim 23, wherein the top gate is electrically connected to the conducting layer to provide a terminal connection and the bottom gate is isolated such that the transistor has a floating bottom gate and has three terminals.

26. A transistor as defined in claim 23 wherein the top gate is electrically connected to the conducting layer which is also electrically connected to the bottom gate such that the transistor has dynamic threshold configuration with three terminals.

27. A Damascene double gated, recessed channel transistor comprising
 an extrinsic region around an intrinsic region,
  wherein the intrinsic region includes a plurality of layers in a trench in a semiconductor substrate, wherein the trench includes a merged gate trench and isolation trench, wherein the extrinsic region includes a source pedestal and a drain pedestal, wherein the gate trench is between the source pedestal and the drain pedestal, wherein the isolation trench is dielectrically filled and surrounds the source pedestal and the drain pedestal,
  wherein the plurality of layers are self-aligned to the trench,
  wherein the layers provide a double gated MOSFET,
   wherein the double gated MOSFET includes a top gate, a gate dielectric, a channel and a bottom gate, and wherein the top gate is over the gate dielectric, the gate dielectric is over the channel and the channel is over the bottom gate,
   wherein the top gate and the bottom gate each have opposing ends,
   wherein the plurality of layers include a conducting layer that extends over the top gate and over at least one end of the top gate and at least one end of the bottom gate, electrically connecting the top gate to the bottom gate to provide a dynamic threshold metal oxide semiconductor (DTMOS) connection with minimal area and minimal capacitance.

* * * * *